(12) United States Patent
Kamada et al.

(10) Patent No.: US 11,859,110 B2
(45) Date of Patent: Jan. 2, 2024

(54) SUBSTRATE LAMINATED BODY AND METHOD OF MANUFACTURING SUBSTRATE LAMINATED BODY

(71) Applicant: Mitsui Chemicals, Inc., Tokyo (JP)

(72) Inventors: Jun Kamada, Narashino (JP); Kazuo Kohmura, Chiba (JP); Yasuhisa Kayaba, Urayasu (JP)

(73) Assignee: MITSUI CHEMICALS, INC., Tokyo (JP)

( * ) Notice: Subject to any disclaimer, the term of this patent is extended or adjusted under 35 U.S.C. 154(b) by 764 days.

(21) Appl. No.: 16/607,898

(22) PCT Filed: Apr. 24, 2018

(86) PCT No.: PCT/JP2018/016681
§ 371 (c)(1),
(2) Date: Oct. 24, 2019

(87) PCT Pub. No.: WO2018/199117
PCT Pub. Date: Nov. 1, 2018

(65) Prior Publication Data
US 2020/0048515 A1    Feb. 13, 2020

(30) Foreign Application Priority Data

Apr. 28, 2017   (JP) ................. 2017-090591

(51) Int. Cl.
| | | |
|---|---|---|
| *C09J 183/04* | (2006.01) | |
| *B32B 7/12* | (2006.01) | |
| *C09J 179/02* | (2006.01) | |
| *H01L 23/00* | (2006.01) | |
| *B32B 15/20* | (2006.01) | |

(Continued)

(52) U.S. Cl.
CPC ............. *C09J 183/04* (2013.01); *B32B 7/12* (2013.01); *B32B 15/20* (2013.01); *B32B 27/28* (2013.01); *B32B 27/34* (2013.01); *C09J 179/02* (2013.01); *H01L 24/00* (2013.01); *H01L 24/32* (2013.01); *B32B 2250/03* (2013.01); *B32B 2255/26* (2013.01); *B32B 2457/14* (2013.01); *H01L 2224/32145* (2013.01); *H01L 2224/8385* (2013.01); *H01L 2924/12041* (2013.01); *H01L 2924/146* (2013.01); *H01L 2924/1434* (2013.01); *H01L 2924/1461* (2013.01)

(58) Field of Classification Search
CPC ........ C09J 183/04; C09J 179/02; C09J 11/06; C09J 201/02; B32B 7/12; B32B 15/20; B32B 2255/26; B32B 2457/14; B32B 2250/03; B32B 2250/40; B32B 2307/50; B32B 2457/00; B32B 15/098; B32B 27/18; B32B 27/20; B32B 27/28; B32B 27/34; B32B 27/42; B32B 15/08; H01L 24/32; H01L 24/83; H01L 41/313; H01L 2224/32145; H01L 2224/8385; H01L 2924/12041; H01L 2924/1434; H01L 2924/146; H01L 2924/1461; H01L 24/29; H01L 25/50; H01L 2224/05647; H01L 2224/08145; H01L 2224/2919; H01L 2224/80903; H01L 2224/83009; H01L 2224/83075; H01L 2224/83097; H01L 2224/83203; H01L 2224/83862; H01L 2224/94; H01L 21/02; H03H 9/0585; B81C 2203/032
See application file for complete search history.

(56) References Cited

U.S. PATENT DOCUMENTS

| | | | | |
|---|---|---|---|---|
| 4,778,727 A | * | 10/1988 | Tesoro ................. | C07F 7/1804 |
| | | | | 428/473.5 |
| 6,071,666 A | * | 6/2000 | Hirano ................. | G03F 7/0757 |
| | | | | 430/165 |
| 6,447,845 B1 | | 9/2002 | Nanavati et al. | |

(Continued)

FOREIGN PATENT DOCUMENTS

| | | |
|---|---|---|
| CN | 101484513 A | 7/2009 |
| JP | H04132258 A | 5/1992 |

(Continued)

OTHER PUBLICATIONS

Extended European Search Report dated Dec. 8, 2020, issued by the European Patent Office in corresponding European Application No. 18791297.7-1107, (7 pages).

(Continued)

*Primary Examiner* — John D Freeman
(74) *Attorney, Agent, or Firm* — BUCHANAN, INGERSOLL & ROONEY PC

(57) ABSTRACT

A body, comprising stacked substrates, wherein: a first substrate, an adhesion layer comprising a reaction product of a compound (A), which has a cationic functional group containing at least one of a primary nitrogen atom or a secondary nitrogen atom and which has a defined weight average molecular weight, and a crosslinking agent (B), which has three or more —C(=O)OX groups in a molecule, in which from one to six of the three or more —C(=O)OX groups are —C(=O)OH groups and which has a weight average molecular weight of from 200 to 600, X is a hydrogen atom or an alkyl group having from 1 to 6 carbon atoms, and a second substrate, are layered in this order, and the compound (A) comprises at least one selected from the group consisting of a defined aliphatic amine and a defined compound having a siloxane bond and an amino group.

17 Claims, No Drawings

(51) Int. Cl.
  *B32B 27/34* (2006.01)
  *B32B 27/28* (2006.01)

(56) References Cited

U.S. PATENT DOCUMENTS

| | | |
|---|---|---|
| 2003/0194573 A1 | 10/2003 | Itoh et al. |
| 2017/0233530 A1 | 8/2017 | Akinaga et al. |
| 2017/0372993 A1 | 12/2017 | Kayaba et al. |

FOREIGN PATENT DOCUMENTS

| | | | |
|---|---|---|---|
| JP | H08259895 A | 10/1996 | |
| JP | 2003525996 A | 9/2003 | |
| JP | 2010226060 A | 10/2010 | |
| JP | 2016047895 A | 4/2016 | |
| WO | 0176866 A1 | 10/2001 | |
| WO | WO-2010008213 A2 * | 1/2010 | ............. H05K 3/389 |
| WO | 2016024457 A1 | 2/2016 | |
| WO | 2016098738 A1 | 6/2016 | |
| WO | 2017086361 A1 | 5/2017 | |

OTHER PUBLICATIONS

Database WPI, Week 201645, Thomson Scientific, London, GB; AN 2016-38283G, XP002801227.
Database WPI, Week 199650, Thomson Scientific, London, GB; AN 1996-502937, XP002801228.
Bayrashev, A. et al., "Silicon wafer bonding through RF dielectric heating", Sensors and Actuators A 103, pp. 16-22, 2003.
International Search Report (PCT/ISA/210) dated Jul. 17, 2018, by the Japan Patent Office as the International Searching Authority for International Application No. PCT/JP2018/016681.
Tong, Q.Y. et al., "Wafer Bonding and Layer Splitting for Microsystems", Advanced Material 11, No. 17, pp. 1409-1425, 1999.
Written Opinion (PCT/ISA/237) dated Jul. 17, 2018, by the Japan Patent Office as the International Searching Authority for International Application No. PCT/JP2018/016681.

* cited by examiner

SUBSTRATE LAMINATED BODY AND METHOD OF MANUFACTURING SUBSTRATE LAMINATED BODY

TECHNICAL FIELD

The present invention relates to a body comprising stacked substrates and a method of manufacturing a body comprising stacked substrates.

BACKGROUND ART

Semiconductor chips and the like are required to be highly integrated as electronic devices are progressively decreased in size and weight and increased in performance. However, such requirements are difficult to meet by miniaturization of circuits. In recent years, a method has been proposed in which high integration is achieved by vertically layering a plurality of semiconductor substrates (wafers), semiconductor chips, and the like, thereby providing a multilayer three-dimensional structure. Methods of layering semiconductor substrates (wafers), semiconductor chips, and the like (hereinafter, sometimes referred to as "semiconductor substrate and the like"), which have been proposed, include a method of direct bonding (fusion bonding) substrates and a method of using an adhesive (see, for example. Patent Documents 1 to 3 and Non-Patent Documents 1 to 2).

PATENT DOCUMENTS

Patent Document 1: Japanese Patent Application Laid-Open (JP-A) No. H 4-132258
Patent Document 2: JP-A No. 2010-226060
Patent Document 3: JP-A No. 2016-47895

Non-Patent Documents

Non-Patent Document 1: A. Bayrashev, B. Ziaie, Sensors and Actuators A 103 (2003) 16-22.
Non-Patent Document 2: Q. Y. Tong, U. M. Gosele, Advanced Material 11, No. 17 (1999) 1409-1425.

SUMMARY OF INVENTION

Problems to be Solved by the Invention

Fusion bonding involves bonding of semiconductor substrates at a temperature of from 400° C. to 600° C. in order not to cause any occurrence of unintended releasing between such semiconductor substrates. However, in a case in which such semiconductor substrates have a semiconductor circuit, a method of bonding at a low temperature of 400° C. or less is required from the viewpoint of suppression of damage to such a semiconductor circuit due to heat. Use of an adhesive is known to enable semiconductor substrates to be bonded at a temperature of 400° C. or less, unlike, for example, a case of bonding by use of silanol bonding.

However, use of a conventional adhesive for bonding semiconductor substrates causes a thickness of more than 10 μm to be required, and may have the problem of an increase in thickness of a body comprising stacked substrates as compared with fusion bonding, in some cases. Furthermore, a decrease in adhesion area is easily caused due to the occurrence of voids by any remaining solvent contained in an adhesive and any gas generated by a crosslinking reaction, and unintended releasing between semiconductor substrates is easily caused.

One aspect of the invention has been made in view of the above problems, and an object thereof is to provide a body comprising stacked substrates which has a thin adhesion layer and which is suppressed in unintended releasing, and to provide a method of manufacturing the body comprising stacked substrates.

Means for Solving the Problems

Specific means for solving the above described problems are as follows.
<1> A body, comprising stacked substrates, wherein:
a first substrate,
an adhesion layer comprising a reaction product of a compound (A), which has a cationic functional group containing at least one of a primary nitrogen atom or a secondary nitrogen atom and which has a weight average molecular weight of from 90 to 400,000, and a cross-linking agent (B), which has three or more —C(=O)OX groups in a molecule, in which from one to six of the three or more —C(=O)OX groups are —C(=O)OH groups and which has a weight average molecular weight of from 200 to 600, X being a hydrogen atom or an alkyl group having from 1 to 6 carbon atoms, and
a second substrate,
are layered in this order, and
the compound (A) comprises at least one selected from the group consisting of an aliphatic amine having a weight average molecular weight of from 10,000 to 400,000 and a compound having a siloxane bond (Si—O bond) and an amino group and having a weight average molecular weight of from 130 to 10,000.
<2> The body, comprising stacked substrates, according to <1>, wherein the adhesion layer has a thickness of from 0.1 nm to 5,000 nm.
<3> The body, comprising stacked substrates, according to <1> or <2>, having a tensile bonding strength of 5 MPa or more.
<4> The body, comprising stacked substrates, according to any one of <1> to <3>, wherein the cross-linking agent (B) has a ring structure in the molecule.
<5> The body, comprising stacked substrates, according to <4>, wherein the ring structure in the cross-linking agent (B) is a ring structure having two or more —C(=O)OX groups.
<6> The body, comprising stacked substrates, according to <4> or <5>, wherein the ring structure is at least one of a benzene ring or a naphthalene ring.
<7> The body, comprising stacked substrates, according to any one of <1> to <6>, wherein at least one X in the three or more —C(=O)OX groups of the cross-linking agent (B) is an alkyl group having from 1 to 6 carbon atoms.
<8> The body, comprising stacked substrates, according to any one of <1> to <7>, wherein the compound having a siloxane bond (Si—O bond) and an amino group and having a weight average molecular weight of from 130 to 10,000 satisfies a relationship of (non-cross-linkable group)/Si<2 as a molar ratio of a non-cross-linkable group bound to an Si element, to the Si element.
<9> The body, comprising stacked substrates, according to any one of <1> to <8>, wherein the reaction product has at least one of an amide bond or an imide bond.
<10> The body, comprising stacked substrates, according to any one of <1> to <9>, wherein a temperature at which a pressure of outgas under a reduced pressure reaches $2 \times 10^{-6}$ Pa is 400° C. or more.

<11> The body, comprising stacked substrates, according to any one of <1> to <10>, wherein at least one of the first substrate or the second substrate is provided with an electrode at a surface thereof, the surface being closer to the adhesion layer.

<12> The body, comprising stacked substrates, according to any one of <1> to <11>, wherein at least one of the first substrate or the second substrate comprises at least one element selected from the group consisting of Si, Al, Ti, Zr, Hf, Fe, Ni, Cu, Ag, Au, Ga, Ge, Sn, Pd, As, Pt, Mg, In, Ta and Nb.

<13> The body, comprising stacked substrates, according to <12>, wherein at least one of the first substrate or the second substrate is a semiconductor substrate comprising at least one element selected from the group consisting of Si, Ga, Ge and As.

<14> A body, comprising stacked substrates, wherein:
a first substrate,
an adhesion layer, and
a second substrate,
are layered in this order,
the adhesion layer has a thickness of from 0.1 nm to 5000 nm, and
the body, comprising stacked substrates, has a tensile bonding strength of 5 MPa or more.

<15> A method of manufacturing a body comprising stacked substrates, the method comprising:
a first step of forming, on a first substrate, a film comprising a compound (A), which has a cationic functional group containing at least one of a primary nitrogen atom or a secondary nitrogen atom and which has a weight average molecular weight of from 90 to 400,000;
a second step of providing, on the film, a cross-linking agent (B), which has three or more —C(=O)OX groups in a molecule, in which from one to six of the three or more —C(=O)OX groups are —C(=O)OH groups and which has a weight average molecular weight of from 200 to 600, X being a hydrogen atom or an alkyl group having from 1 to 6 carbon atoms;
a third step of layering a second substrate on a surface on which a film comprising the compound (A) and the cross-linking agent (B) is formed; and
a heating step of heating the film comprising the compound (A) and the cross-linking agent (B) to a temperature of from 70° C. to 450° C., thereby forming an adhesion layer comprising a reaction product of the compound (A) and the cross-linking agent (B),
wherein the compound (A) comprises at least one selected from the group consisting of an aliphatic amine having a weight average molecular weight of from 10,000 to 400,000 and a compound having a siloxane bond (Si—O bond) and an amino group and having a weight average molecular weight of from 130 to 10,000.

<16> A method of manufacturing a body comprising stacked substrates, the method comprising:
a fifth step of forming, on a first substrate, a film comprising a compound (A), which has a cationic functional group containing at least one of a primary nitrogen atom or a secondary nitrogen atom and which has a weight average molecular weight of from 90 to 400,000, and a cross-linking agent (B), which has three or more —C(=O)OX groups in a molecule, in which from one to six of the three or more —C(=O)OX groups are —C(=O)OH groups and which has a weight average molecular weight of from 200 to 600, X being a hydrogen atom or an alkyl group having from 1 to 6 carbon atoms;
a sixth step of layering a second substrate on a surface at which the film including the compound (A) and the cross-linking agent (B) is formed; and
a heating step of heating the film comprising the compound (A) and the cross-linking agent (B) to a temperature of from 70° C. to 450° C., thereby forming an adhesion layer comprising a reaction product of the compound (A) and the cross-linking agent (B),
wherein the compound (A) comprises at least one selected from the group consisting of an aliphatic amine having a weight average molecular weight of from 10,000 to 400,000 and a compound having a siloxane bond (Si—O bond) and an amino group and having a weight average molecular weight of from 130 to 10,000.

<17> The method of manufacturing a body comprising stacked substrates according to <15> or <16>, wherein a surface of the first substrate or the second substrate, on which the film comprising the compound (A) and the cross-linking agent (B) is to be formed, has at least one selected from the group consisting of a hydroxyl group, an epoxy group, a carboxy group, an amino group and a mercapto group.

<18> The method of manufacturing a body comprising stacked substrates according to <17>, wherein:
at least one of the first substrate or the second substrate comprises at least one element selected from the group consisting of Si, Al, Ti, Zr, Hf, Fe, Ni, Cu, Ag, Au, Ga, Ge, Sn, Pd, As, Pt, Mg, In, Ta and Nb, and
the at least one selected from the group consisting of a hydroxyl group, an epoxy group, a carboxy group, an amino group and a mercapto group, is bound to the at least one element.

<19> The method of manufacturing a body comprising stacked substrates according to <18>, wherein the surface of the first substrate or the second substrate, on which the film including the compound (A) and the cross-linking agent (B) is to be formed, has a silanol group (Si—OH group).

Effects of the Invention

One aspect of the invention can provide a body comprising stacked substrates which has a thin adhesion layer and which is suppressed in unintended releasing, and provide a method of manufacturing the body comprising stacked substrates.

DESCRIPTION OF EMBODIMENTS

Herein, a numeral value range represented by "from . . . to . . . " means a range including the numeral values represented before and after "to" as a lower limit value and an upper limit value, respectively.

An upper limit or a lower limit described in one numeral value range, among numeral value ranges stepwisely described herein, may be replaced with an upper limit or a lower limit of other numeral value range stepwisely described. An upper limit or a lower limit disclosed herein may be replaced with any value shown in Examples.

[Stacked Substrates Body]

Hereinafter, one embodiment of the body including stacked substrates (stacked substrates body) of the invention will be described. A stacked substrates body of the present embodiment has a configuration where a first substrate, an adhesion layer including a reaction product of a compound (A) which has a cationic functional group containing at least one of a primary nitrogen atom or a secondary nitrogen atom and which has a weight average molecular weight of from 90 to 400000 and a crosslinking agent (B) which has three or more —C(=O)OX groups (X is a hydrogen atom or an alkyl group having from 1 to 6 carbon atoms) in a molecule, in which from one to six of the three or more —C(=O)OX groups are —C(=O)OH groups and which has a weight average molecular weight of from 200 to 600, and a second substrate are layered in the listed order. The compound (A) preferably includes at least one selected from the group consisting of an aliphatic amine having a weight average molecular weight of from 10000 to 400000 and a compound having a siloxane bond (Si—O bond) and an amino group and having a weight average molecular weight of from 130 to 10000.

In the stacked substrates body of the embodiment, the first substrate and the second substrate are bonded by the adhesion layer including the reaction product of the compound (A) and the crosslinking agent (B). The adhesion layer, which is formed on a surface of the first substrate, has a surface excellent in smoothness, and thus can have a uniform thickness and is also excellent in bonding strength between the substrates. The adhesion layer, which is also excellent in bonding strength between the substrates even in the case of having a reduced thickness, is thus advantageous in a case in which a multilayer three-dimensional structure is formed with a decrease in size being achieved. The adhesion layer, which can be reduced in thickness, thus allows a polar solvent (D) to be easily volatilized, resulting in suppression of the occurrence of a void, in manufacturing of the stacked substrates body. Such suppression of the occurrence of a void enables an adhesion area to be hardly small, resulting in suppression of unintended releasing of the substrates.

[Adhesion Layer]

The stacked substrates body of the embodiment includes an adhesion layer including a reaction product of a compound (A) which has a cationic functional group containing at least one of a primary nitrogen atom or a secondary nitrogen atom and which has a weight average molecular weight of from 90 to 400000 and a crosslinking agent (B) which has three or more —C(=O)OX groups (X is a hydrogen atom or an alkyl group having from 1 to 6 carbon atoms) in a molecule, in which from one to six of the three or more —C(=O)OX groups are —C(=O)OF groups and which has a weight average molecular weight of from 200 to 600. The adhesion layer is excellent in bonding strength between the substrates, and can suppress releasing of the substrates.

The thickness of the adhesion layer is preferably from 0.1 nm to 5000 nm, more preferably from 0.5 nm to 3000 nm, still more preferably from 0.5 nm to 2000 nm, particularly preferably from 0.5 nm to 1000 nm, much more preferably from 0.5 nm to 500 nm. The stacked substrates body of the embodiment can ensure a high bonding strength between the substrates even at a relatively thin thickness of the adhesion layer, of from 0.1 nm to 5000 nm. The thickness of the adhesion layer may be determined by releasing at least one of the substrates from the stacked substrates body and subjecting the resultant to measurement with an ellipsometer. In the case of a thickness of 10 nm or more, fitting may be performed with an optical model of air/(Cauchy+Lorenz oscillator model)/natural oxide film/silicon substrate. In the case of a thickness of less than 10 nm, fitting may be performed with an optical model of air/SiO$_2$/natural oxide film/silicon substrate. In a case in which such releasing is difficult, such measurement may be made by cutting the stacked substrates body and observing the resulting cut surface with a scanning electron microscope (SEM) or a transmission electron microscope (TEM). SEM or TEM may be selected depending on the thickness of the stacked substrates body.

The reaction product in the adhesion layer preferably includes at least one of an amide bond or an imide bond from the viewpoint of imparting excellent heat resistance.

(Compound (A))

The compound (A) is a compound which has a cationic functional group containing at least one of a primary nitrogen atom or a secondary nitrogen atom and which has a weight average molecular weight of from 90 to 400000. The cationic functional group is not particularly limited as long as the functional group is a functional group which can be positively charged and which contains at least one of a primary nitrogen atom or a secondary nitrogen atom.

The compound (A) may contain a tertiary nitrogen atom, in addition to the primary nitrogen atom and the secondary nitrogen atom.

Herein, the "primary nitrogen atom" refers to a nitrogen atom (for example, a nitrogen atom contained in a primary amino group (—NH$_2$ group)) bonded to only two hydrogen atoms and one atom other than a hydrogen atom, or a nitrogen atom (cation) bonded to only three hydrogen atoms and one atom other than a hydrogen atom.

The "secondary nitrogen atom" refers to a nitrogen atom (namely, a nitrogen atom contained in a functional group represented by the following Formula (a)) bonded to only one hydrogen atom and two atoms other than a hydrogen atom, or a nitrogen atom (cation) bonded to only two hydrogen atoms and two atoms other than a hydrogen atom.

The "tertiary nitrogen atom" refers to a nitrogen atom (namely, a nitrogen atom contained in a functional group represented by the following Formula (b)) bonded to only three atoms other than a hydrogen atom, or a nitrogen atom (cation) bonded to only one hydrogen atom and three atoms other than a hydrogen atom.

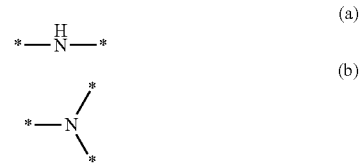

In Formula (a) and Formula (b), * represents a bonding position with an atom other than a hydrogen atom.

The functional group represented by Formula (a) may be a functional group constituting a part of a secondary amino group (—NHR$^a$ group; wherein RR represents an alkyl group), or may be a divalent linking group contained in the skeleton of the polymer.

The functional group represented by Formula (b) (namely, a tertiary nitrogen atom) may be a functional group constituting a part of a tertiary amino group (—NR$^b$R$^c$ group; wherein R$^b$ and R$^c$ each independently represent an alkyl group), or may be a trivalent linking group contained in the skeleton of the polymer.

The weight average molecular weight of the compound (A) is from 90 to 400000. Examples of the compound (A) include an aliphatic amine and a compound having a siloxane bond (Si—O bond) and an amino group. In a case in which the compound (A) is an aliphatic amine, the weight average molecular weight is preferably from 10000 to 200000. In a case in which the compound (A) is a compound having a siloxane bond (Si—O bond) and an amino group, the weight average molecular weight is preferably from 130 to 10000, more preferably from 130 to 5000, further preferably from 130 to 2000.

The weight average molecular weight herein refers to a weight average molecular weight of any other than a monomer, in terms of polyethylene glycol, as measured by a GPC (Gel Permeation Chromatography) method.

Specifically, the weight average molecular weight is calculated in analysis software (EMPOWER 3 manufactured by Waters Corporation) with polyethylene glycol/polyethylene oxide as a standard by detecting the refractive index at a flow rate of 1.0 mL/min with an aqueous solution having a concentration of sodium nitrate of 0.1 mol/L as a developing solvent, by use of an analyzer Shodex DET RI-101 and two analytical columns (TSKgel G6000 PWXL-CP and TSKgel G3000 PWXL-CP manufactured by TOSOH CORPORATION).

The compound (A) may further have, if necessary, an anionic functional group, a nonionic functional group, or the like.

The nonionic functional group may be a hydrogen bond receptor or a hydrogen bond doner. Examples of the nonionic functional group can include a hydroxy group, a carbonyl group, and an ether group (—O—).

The anionic functional group is not particularly limited as long as the functional group is a functional group which can be negatively charged. Examples of the anionic functional group can include a carboxylic acid group, a sulfonic acid group, and a sulfuric acid group.

Examples of the compound (A) include an aliphatic amine, more specifically, a polyalkyleneimine which is a polymer of an alkyleneimine such as ethylene imine, propyleneimine, butylene imine, pentylene imine, hexylene imine, heptylene imine, octylene imine, trimethylene imine, tetramethylene imine, pentamethylene imine, hexamethylene imine, or octamethylene imine: polyallylamine; and polyacrylamide.

Polyethyleneimine (PEI) can be produced by a known method described in Japanese Patent Publication (JP-B) No. S43-8828. JP-B No. S49-33120, JP-A No. 2001-213958, WO 2010/137711, or the like. Polyalkyleneimine other than polyethyleneimine can also be produced by a similar method as in polyethyleneimine.

It is also preferable that the compound (A) is a derivative of the above polyalkyleneimine (polyalkyleneimine derivative; particularly preferably polyethyleneimine derivative). The polyalkyleneimine derivative is not particularly limited as long as the derivative is a compound which can be produced using the polyalkyleneimine. Specific examples can include a polyalkyleneimine derivative obtained by introducing an alkyl group (preferably an alkyl group having from 1 to 10 carbon atoms), an aryl group, or the like into the polyalkyleneimine, and a polyalkyleneimine derivative obtained by introducing a crosslinkable group such as a hydroxyl group into the polyalkyleneimine.

Such polyalkyleneimine derivatives can be produced by a method commonly performed using the polyalkyleneimine. Specifically, such derivatives can be produced according to the method described in, for example, JP-A No. H06-016809.

A preferable polyalkyleneimine derivative is also a highly branched type polyalkyleneimine obtained by allowing a cationic functional group-containing monomer to react with the polyalkyleneimine to result in an enhancement in the branching degree of the polyalkyleneimine.

Examples of the method of obtaining such a highly branched type polyalkyleneimine include a method in which a cationic functional group-containing monomer is allowed to react with a polyalkyleneimine having a plurality of secondary nitrogen atoms in the backbone, thereby replacing at least one of the plurality of secondary nitrogen atoms with the cationic functional group-containing monomer, and a method in which a cationic functional group-containing monomer is allowed to react with a polyalkyleneimine having a plurality of primary nitrogen atoms at a terminal, thereby replacing at least one of the plurality of primary nitrogen atoms with the cationic functional group-containing monomer.

Examples of the cationic functional group introduced for an enhancement in the branching degree can include an aminoethyl group, an aminopropyl group, a diaminopropyl group, an aminobutyl group, a diaminobutyl group, and a triaminobutyl group, and an aminoethyl group is preferable from the viewpoint of decreasing the equivalent of the cationic functional group and increasing the density of the cationic functional group.

The polyethyleneimine and the derivative thereof may be each a commercially available product. For example, the polyethyleneimine and the derivative thereof may be each appropriately selected from any polyethyleneimines and derivatives thereof which are commercially available from NIPPON SHOKUBAI CO., LTD., BASF SE, MP-Biomedicals, LLC., and the like.

Examples of the compound (A) include a compound having a Si—O bond and an amino group, in addition to the above aliphatic amine. Examples of the compound having a Si—O bond and an amino group include siloxane diamine, a silane coupling agent having an amino group, and a siloxane polymer of a silane coupling agent having an amino group.

Examples of the silane coupling agent having an amino group include a compound represented by the following Formula (A-3).

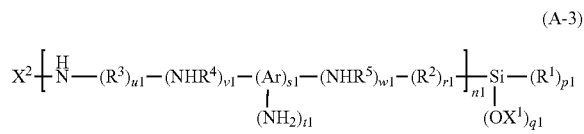

(A-3)

$$X^2 \left[ \underset{\underset{(NH_2)_{t1}}{|}}{\overset{H}{N}} - (R^3)_{u1} - (NHR^4)_{v1} - (Ar)_{s1} - (NHR^5)_{w1} - (R^2)_{r1} \right]_{n1} \underset{\underset{(OX^1)_{q1}}{|}}{Si} - (R^1)_{p1}$$

p1 = 0-2, q1 = 1-3, n1 = 1-3, r1, = 0-1, s1 = 0-1, t1 = 0-1, u1 = 0-1, v1 = 0-1, w1 = 0-1, p1 + q1 = 3

$R^1$ in Formula (A-3) represents an optionally substituted alkyl group having from 1 to 4 carbon atoms. $R^2$ and $R^3$ each independently represent an optionally substituted alkylene group having from 1 to 12 carbon atoms (the group optionally containing a carbonyl group, an ether group, or the like in the skeleton), an ether group, or a carbonyl group. $R^4$ and $R^5$ each independently represent an optionally substituted alkylene group having from 1 to 4 carbon atoms, or a single bond. Ar represents a divalent or trivalent aromatic ring. $X^1$ represents hydrogen, or an optionally substituted alkyl group having from 1 to 5 carbon atoms. $X^2$ represents hydrogen, a cycloalkyl group, a heterocyclic group, an aryl group, or an optionally substituted alkyl group having from 1 to 5 carbon atoms (the group optionally containing a carbonyl group, an ether group, or the like in the skeleton). A plurality of $R^3$'s, $R^2$'s, $R^3$'s, $R^4$'s, $R^5$'s, and $X^1$'s may be each the same as or different from each other.

Examples of each substituent of the alkyl groups and the alkylene groups in $R^1$, $R^2$, $R^3$, $R^4$, $R^5$, $X^1$, and $X^2$ independently include an amino group, a hydroxy group, an alkoxy group, a cyano group, a carboxylic acid group, a sulfonic acid group, and halogen.

Examples of the divalent or trivalent aromatic ring in Ar include a divalent or trivalent benzene ring. Examples of the aryl group in $X^2$ include a phenyl group, a methylbenzyl group, and a vinylbenzyl group.

Specific examples of the silane coupling agent represented by Formula (A-3) include N-(2-aminoethyl)-3-aminopropylmethyldiethoxysilane, N-(2-aminoethyl)-3-aminopropyltriethoxysilane, N-(2-aminoethyl)-3-aminoisobutyldimethylmethoxysilane, N-(2-aminoethyl)-3-aminoisobutylmethyldimethoxysilane, N-(2-aminoethyl)-11-aminoundecyltrimethoxysilane, 3-aminopropyltrimethoxysilane, 3-aminopropyltriethoxysilane, N-phenyl-3-aminopropyltrimethoxysilane, (aminoethylaminoethyl)phenyltriethoxysilane, methylbenzylaminoethylaminopropyltrimethoxysilane, benzylaminoethylaminopropyltriethoxysilane, 3-ureidopropyltriethoxysilane, (aminoethylaminoethyl)phenethyltrimethoxysilane, (aminoethylaminomethyl)phenethyltrimethoxysilane, N-[2-[3-(trimethoxysilyl)propylamino]ethyl]ethylenediamine, 3-aminopropyldiethoxymethylsilane, 3-aminopropyldimethoxymethylsilane, 3-aminopropyldimethylethoxysilane, 3-aminopropyldimethylmethoxysilane, trimethoxy[2-(2-aminoethyl)-3-aminopropyl]silane, diaminomethylmethyldiethoxysilane, methylaminomethylmethyldiethoxysilane, p-aminophenyltrimethoxysilane, N-methylaminopropyltriethoxysilane, N-methylaminopropylmethyldiethoxysilane, (phenylaminomethyl)methyldiethoxysilane, acetamidopropyltrimethoxysilane, and hydrolysates thereof.

Examples of other silane coupling agent having an amino group, than that represented by Formula (A-3), include N,N-bis[3-(trimethoxysilyl)propyl]ethylenediamine, N,N'-bis[3-(trimethoxysilyl)propyl]ethylenediamine, bis[(3-triethoxysilyl)propyl]amine, piperazinylpropylmethyldimethoxysilane, bis[3-(triethoxysilyl)propyl]urea, bis (methyldiethoxysilylpropyl)amine, 2,2-dimethoxy-1,6-diaza-2-silacyclooctane, 3,5-diamino-N-(4-(methoxydimethylsilyl)phenyl)benzamide, 3,5-diamino-N-(4-(triethoxysilyl)phenyl)benzamide, 5-(ethoxydimethylsilyl)benzene-1,3-diamine, and hydrolysates thereof.

The silane coupling agent having an amino group may be used singly, or in combination of two or more kinds thereof. The silane coupling agent having an amino group may be used in combination with a silane coupling agent having no amino group. For example, a silane coupling agent having a mercapto group may be used in order to improve adhesiveness to a metal.

A polymer (siloxane polymer) formed from such a silane coupling agent via a siloxane bond (Si—O—Si) may also be used. For example, a polymer having a linear siloxane structure, a polymer having a branched siloxane structure, a polymer having a cyclic siloxane structure, a polymer having a cage-like siloxane structure, or the like can be obtained from a hydrolysate of 3-aminopropyltrimethoxysilane. Such a cage-like siloxane structure is represented by, for example, the following Formula (A-1).

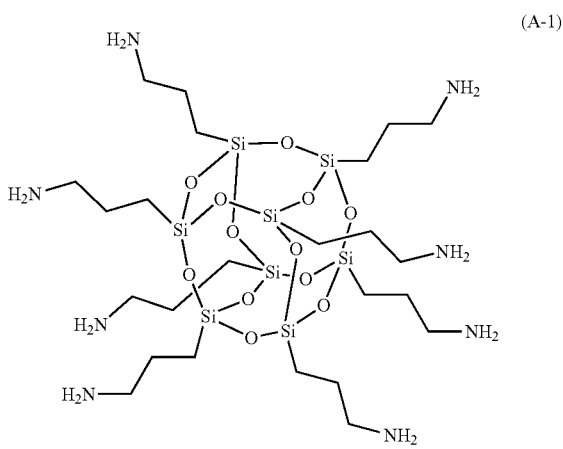 [SMILES: NCCC[Si]12O[Si]3(CCCN)O[Si]4(CCCN)O[Si](CCCN)(O1)O[Si]1(CCCN)O[Si](CCCN)(O2)O[Si](CCCN)(O3)O[Si](CCCN)(O4)O1]

(A-1)

Examples of the siloxane diamine include a compound represented by the following Formula (A-2). In Formula (A-2), i is an integer of from 0 to 4, j is an integer of from 1 to 3, and Me is a methyl group.

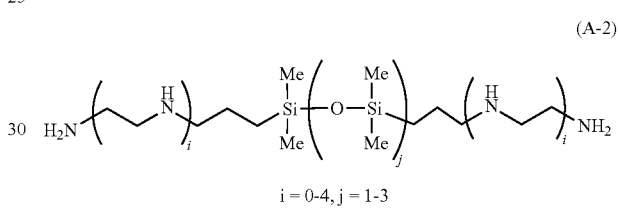

(A-2)

i = 0-4, j = 1-3

Examples of the siloxane diamine include 1,3-bis(3-aminopropyl)tetramethyldisiloxane (i=0 and j=1 in Formula (A-2)) and 1,3-bis(2-aminoethylamino)propyltetramethyldisiloxane (i=1 and j=1 in Formula (A-2)).

Examples of the compound (A) include an amine compound having not any Si—O bond, but a ring structure in the molecule, in addition to the aliphatic amine and the compound having a Si—O bond and an amino group. The compound (A) may contain not only at least one selected from the group consisting of the aliphatic amine and the compound having a Si—O bond and an amino group, but also an amine compound having not any Si—O bond, but a ring structure in the molecule, in particular, an amine compound having not any Si—O bond, but a ring structure in the molecule, and having a weight average molecular weight of from 90 to 600. Examples of the amine compound having not any Si—O bond, but a ring structure in the molecule, and having a weight average molecular weight of from 90 to 600 include an alicyclic amine, an aromatic ring amine, and a heterocyclic (aminocyclic) amine. The amine compound may have a plurality of ring structures in the molecule, and the plurality of ring structures may be the same as or different from each other. Such an amine compound having a ring structure is more preferably a compound having an aromatic ring because a thermally more stable compound is easily obtained.

The amine compound having not any Si—O bond, but a ring structure in the molecule, and having a weight average molecular weight of from 90 to 600 is preferably a compound having a primary amino group from the viewpoint of being capable of easily forming a thermally crosslinked structure such as amide, amide-imide, or imide with the crosslinking agent (B) and enhancing heat resistance. The above amine compound is preferably a diamine compound having two primary amino groups, a triamine compound having three primary amino groups, or the like from the viewpoint of being capable of easily increasing the number of thermally crosslinked structures such as amide, amide-imide, or imide with the crosslinking agent (B) and more enhancing heat resistance.

Examples of the alicyclic amine include cyclohexylamine and dimethylaminocyclohexane.

Examples of the aromatic ring amine include diaminodiphenyl ether, xylenediamine (preferably p-xylenediamine), diaminobenzene, diaminotoluene, methylenedianiline, dimethyldiaminobiphenyl, bis (trifluoromethyl) diaminobiphenyl, diaminobenzophenone, diaminobenzanilide, bis(aminophenyl)fluorene, bis(aminophenoxy)benzene, bis(aminophenoxy)biphenyl, dicarboxydiaminodiphenylmethane, diaminoresorcin, dihydroxybenzidine, diaminobenzidine, 1,3,5-triaminophenoxybenzene, 2,2'-dimethylbenzidine, tris(4-aminophenyl)amine, 2,7-diaminofluorene, 1,9-diaminofluorene, and dibenzylamine.

Examples of the heterocyclic ring of a heterocyclic amine include a heterocyclic ring containing a sulfur atom as a heteroatom (for example, a thiophene ring), or a heterocyclic ring containing a nitrogen atom as a heteroatom (for example, a 5-membered ring such as a pyrrole ring, a pyrrolidine ring, a pyrazole ring, an imidazole ring, or a triazole ring; a 6-membered ring such as an isocyanuryl ring, a pyridine ring, a pyridazine ring, a pyrimidine ring, a pyrazine ring, a piperidine ring, a piperazine ring, or a triazine ring; or a condensed ring such as an indole ring, an indoline ring, a quinoline ring, an acridine ring, a naphthyridine ring, a quinazoline ring, a purine ring, or a quinoxaline ring).

Examples of a heterocyclic amine having a nitrogen-containing heterocyclic ring include melamine, ammeline, melam, melem, and tris(4-aminophenyl)amine.

Examples of an amine compound having both a heterocyclic ring and an aromatic ring include N2,N4,N6-tris(4-aminophenyl)-1,3,5-triazine-2,4,6-triamine.

The compound (A) has a primary or secondary amino group, and thus can electrostatically interact with a functional group such as a hydroxyl group, an epoxy group, a carboxy group, an amino group, or a mercapto group which can be present on surfaces of the first substrate and the second substrate, or can tightly form a covalent bond with the functional group, thereby allowing the substrates to strongly adhere to each other.

The compound (A) has a primary or secondary amino group, and thus is easily dissolved in a polar solvent (D) described below. Such a compound (A) to be easily dissolved in the polar solvent (D) is used, thereby increasing affinity with a hydrophilic surface of a substrate such as a silicon substrate, whereby a smooth film can be easily formed and the thickness of the adhesion layer can be decreased.

The compound (A) is preferably the aliphatic amine or the compound having a Si—O bond and an amino group from the viewpoint of formation of a smooth thin film, and is more preferably the compound having a Si—O bond and an amino group from the viewpoint of heat resistance. The compound (A) is preferably a compound having a Si—O bond and a primary amino group from the viewpoint of formation of a thermally crosslinked structure such as amide, amide-imide, or imide for a more enhancement in heat resistance.

In a case in which the compound (A) contains the compound having a Si—O bond and an amino group, the ratio of the total number of primary nitrogen atoms and secondary nitrogen atoms to the number of silicon atoms (total number of primary nitrogen atoms and secondary nitrogen atoms/number of silicon atoms) in the compound (A) is preferably from 0.2 to 5 from the viewpoint of formation of a smooth thin film.

In a case in which the compound (A) contains the compound having a Si—O bond and an amino group, the molar ratio of a non-crosslinkable group such as a methyl group bound to a Si element to a Si element in the compound having a Si—O bond and an amino group preferably satisfies a relationship of (non-crosslinkable group)/Si<2 from the viewpoint of adhesion ability of the substrates.

It is presumed that when this relationship can be satisfied, the density of crosslinking (crosslinking of a Si—O—Si bond with an amide bond, an imide bond, or the like) in the resultant film is increased, the substrates are bonded with a sufficient adhesion force, and releasing of the substrates is suppressed.

As described above, the compound (A) has a cationic functional group containing at least one of a primary nitrogen atom or a secondary nitrogen atom. In a case in which the compound (A) contains a primary nitrogen atom, the proportion of the primary nitrogen atom in all the nitrogen atoms in the compound (A) is preferably 20% by mol or more, more preferably 25% by mol or more, further preferably 30% by mol or more. The compound (A) may have a cationic functional group containing a primary nitrogen atom and containing no nitrogen atom other than the primary nitrogen atom (for example, a secondary nitrogen atom or a tertiary nitrogen atom).

In a case in which the compound (A) contains a secondary nitrogen atom, the proportion of the secondary nitrogen atom in all the nitrogen atoms in the compound (A) is preferably from 5% by mol to 50% by mol, more preferably from 10% by mol to 45% by mol.

The compound (A) may contain a tertiary nitrogen atom, in addition to the primary nitrogen atom and the secondary nitrogen atom. In a case in which the compound (A) contains a tertiary nitrogen atom, the proportion of the tertiary nitrogen atom in all the nitrogen atoms in the compound (A) is preferably from 20% by mol to 50% by mol, more preferably from 25% by mol to 45% by mol.

In the embodiment, the content of the component derived from the compound (A) in the adhesion layer is not particularly limited, and can be, for example, from 1% by mass to 82% by mass or less and is preferably from 5% by mass to 82% by mass, more preferably from 13% by mass to 82% by mass, with respect to the entire adhesion layer.

(Crosslinking Agent (B))

The crosslinking agent (B) is a compound which has three or more —C(=O)OX groups (X is a hydrogen atom or an alkyl group having from 1 to 6 carbon atoms) in the molecule, in which from one to six of three or more —C(=O)OX groups (hereinafter, also referred to as "COOX".) are —C(=O)OH groups (hereinafter, also referred to as "COOH".) and which has a weight average molecular weight of from 200 to 600.

The crosslinking agent (B) is a compound having three or more —C(=O)OX groups in the molecule (X is a hydrogen atom or an alkyl group having from 1 to 6 carbon atoms), and is preferably a compound having from three to six —C(=O)OX groups in the molecule, more preferably a compound having three or four —C(=O)OX groups in the molecule.

Examples of each X in the —C(=O)OX groups in the crosslinking agent (B) include a hydrogen atom, or an alkyl group having from 1 to 6 carbon atoms, and in particular, a hydrogen atom, a methyl group, an ethyl group, and a propyl group are preferable. X's in the —C(═O)OX groups may be the same as or different from each other.

The crosslinking agent (B) is a compound having from one to six —C(═O)OH groups, which corresponds to a case in which X is hydrogen atom, in the molecule, and is preferably a compound having from one to four —C(═O)OH groups in the molecule, more preferably a compound having from two to four —C(═O)OH groups in the molecule, still more preferably a compound having two or three —C(═O)OH groups in the molecule.

The crosslinking agent (B) is a compound having a weight average molecular weight of from 200 to 600, and is preferably a compound having a weight average molecular weight of from 200 to 400.

The crosslinking agent (B) preferably have a ring structure in the molecule. Examples of the ring structure include an alicyclic structure and an aromatic ring structure. The crosslinking agent (B) may have a plurality of ring structures in the molecule, and the plurality of ring structures may be the same as or different from each other.

Examples of the alicyclic structure include an alicyclic structure having from 3 to 8 carbon atoms, preferably include an alicyclic structure having from 4 to 6, and the ring structure may be a saturated or unsaturated ring structure. More specific examples of the alicyclic structure include a saturated alicyclic structure such as a cyclopropane ring, a cyclobutane ring, a cyclopentane ring, a cyclohexane ring, a cycloheptane ring, or a cyclooctane ring; and an unsaturated alicyclic structure such as a cyclopropene ring, a cyclobutene ring, a cyclopentene ring, a cyclohexene ring, a cycloheptene ring, or a cyclooctene ring.

The aromatic ring structure is not particularly limited as long as the structure is a ring structure exhibiting aromaticity, and examples include a benzene aromatic ring such as a benzene ring, a naphthalene ring, an anthracene ring, or a perylene ring, an aromatic heterocyclic ring such as a pyridine ring or a thiophene ring, and a nonbenzene aromatic ring such as an indene ring or an azulene ring.

The ring structure of the crosslinking agent (B) in the molecule is preferably, for example, at least one selected from the group consisting of a cyclobutane ring, a cyclopentane ring, a cyclohexane ring, a benzene ring, and a naphthalene ring, and is more preferably at least one of a benzene ring or a naphthalene ring from the viewpoint of further enhancing heat resistance of the adhesion layer.

As described above, the crosslinking agent (B) may have a plurality of ring structures in the molecule, and may have a biphenyl structure, a benzophenone structure, a diphenyl ether structure, or the like in a case in which the ring structure is benzene.

The ring structure of the crosslinking agent (B) in the molecule is preferably a ring structure having two or more —C(═O)OX groups.

The crosslinking agent (B) preferably has a fluorine atom in the molecule, more preferably has from one to six fluorine atoms in the molecule, further preferably has from three to six fluorine atoms in the molecule. For example, the crosslinking agent (B) may have a fluoroalkyl group in the molecule, specifically, may have a trifluoroalkyl group or a hexafluoroisopropyl group.

Examples of the crosslinking agent (B) further include a carboxylic acid compound such as alicyclic carboxylic acid, benzenecarboxylic acid, naphthalenecarboxylic acid, diphthalic acid, or fluorinated aromatic ring carboxylic acid; and a carboxylic acid ester compound such as an alicyclic carboxylic acid ester, a benzenecarboxylic acid ester, a naphthalenecarboxylic acid ester, a diphthalic acid ester, or a fluorinated aromatic ring carboxylic acid ester. The carboxylic acid ester compound is a compound which has a carboxy group (—C(═O)OH group) in the molecule and in which at least one X in three or more —C(═O)OX groups is an alkyl group having from 1 to 6 carbon atoms (in other words, an ester bond is contained). In the embodiment, the crosslinking agent (B) is such a carboxylic acid ester compound, whereby aggregation due to association of the compound (A) with the crosslinking agent (B) is inhibited, aggregates and pits are decreased, and the film thickness is easily adjusted.

The carboxylic acid compound is preferably a tetravalent or lower carboxylic acid compound containing four or less —C(═O)OH groups, more preferably a trivalent or tetravalent carboxylic acid compound containing three or four —C(═O)OH groups.

The carboxylic acid ester compound is preferably a compound containing three or less carboxy groups (—C(═O)OH groups) and three or less ester bonds in the molecule, more preferably a compound containing two or less carboxy groups and two or less ester bonds in the molecule.

In a case in which each X in three or more —C(═O)OX groups in the carboxylic acid ester compound is an alkyl group having from 1 to 6 carbon atoms, such X is preferably a methyl group, an ethyl group, a propyl group, a butyl group, or the like and is preferably an ethyl group or a propyl group from the viewpoint that aggregation due to association of the compound (A) with the crosslinking agent (B) is inhibited.

Specific examples of the carboxylic acid compound include, without any limitation, an alicyclic carboxylic acid such as 1,2,3,4-cyclobutanetetracarboxylic acid, 1,2,3,4-cyclopentanetetracarboxylic acid, 1,3,5-cyclohexanetricarboxylic acid, 1,2,4-cyclohexanetricarboxylic acid, 1,2,4,5-cyclohexanetetracarboxylic acid, or 1,2,3,4,5,6-cyclohexanehexacarboxylic acid; a benzenecarboxylic acid such as 1,2,4-benzenetricarboxylic acid, 1,3,5-benzenetricarboxylic acid, pyromellitic acid, benzenepentacarboxylic acid, or mellitic acid; a naphthalenecarboxylic acid such as 1,4,5,8-naphthalenetetracarboxylic acid or 2,3,6,7-naphthalenetetracarboxylic acid; a diphthalic acid such as 3,3',5,5'-tetracarboxy diphenylmethane, biphenyl-3,3',5,5'-tetracarboxylic acid, biphenyl-3,4',5-tricarboxylic acid, biphenyl-3,3',4,4'-tetracarboxylic acid, benzophenone-3,3',4,4'-tetracarboxylic acid, 4,4'-oxydiphthalic acid, 3,4'-oxydiphthalic acid, 1,3-bis(phthalic acid)tetramethyldisiloxane, 4,4'-(ethyne-1,2-diyl)diphthalic acid (4,4'-(Ethyne-1,2-diyl)diphthalic acid), 4,4'-(1,4-phenylenebis(oxy))diphthalic acid (4,4'-(1,4-phenylenebis(oxy))diphthalic acid), 4,4'-([1,1'-biphenyl]-4,4'-diylbis(oxy))diphthalic acid, (4,4'-([1,1'-biphenyl]-4,4'-diylbis(oxy))diphthalic acid), 4,4'-((oxybis(4,1-phenylene))bis(oxy))diphthalic acid, or (4,4'-((oxybis(4,1-phenylene))bis(oxy))diphthalic acid); a perylene carboxylic acid such as perylene-3,4,9,10-tetracarboxylic acid; an anthracene carboxylic acid such as anthracene-2,3,6,7-tetracarboxylic acid; and a fluorinated aromatic ring carboxylic acid such as 4,4'-(hexafluoroisopropylidene)diphthalic acid, 9,9-bis(trifluoromethyl)-9H-xanthene-2,3,6,7-tetracarboxylic acid, or 1,4-ditrifluoromethylpyromellitic acid.

Specific examples of the carboxylic acid ester compound include any compound in the above specific examples of the carboxylic acid compound, in which at least one carboxy group is substituted with an ester group. Examples of the carboxylic acid ester compound include half esterified compounds represented by the following Formulae (B-1) to (B-6).

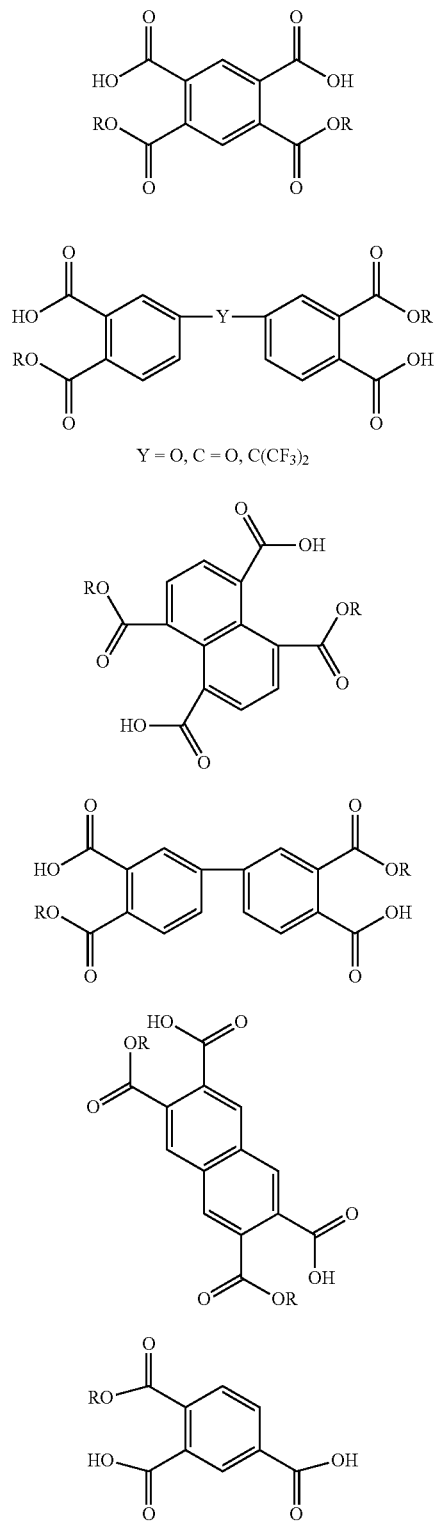

Each R in Formulae (B-1) to (B-6) is independently an alkyl group having from 1 to 6 carbon atoms, and, in particular, is preferably a methyl group, an ethyl group, a propyl group, or a butyl group, more preferably an ethyl group or a propyl group.

Such a half-esterified compound can be produced by, for example, mixing carboxylic acid anhydride as an anhydride of the above carboxylic acid compound, with an alcohol solvent, and opening the carboxylic acid anhydride.

In the embodiment, the content of the component derived from the crosslinking agent (B) in the adhesion layer is not particularly limited, and, for example, the ratio ((—(C═O)—Y)/N) of the number of carbonyl groups (—(C═O)—Y) in the substance derived from the crosslinking agent (B) to the number of all the nitrogen atoms in the substance derived from the compound (A) is preferably from 0.1 to 3.0, more preferably from 0.3 to 2.5, further preferably from 0.4 to 2.2. Y in —(C═O)—Y represents a nitrogen atom imide-crosslinked or amide-crosslinked, OH, or an ester group. The ratio (—(C═O)—Y)/N is from 0.1 to 3.0, whereby the adhesion layer suitably has a thermally crosslinked structure such as amide, amide-imide, or imide, and is more excellent in heat resistance.

The compound (A) has an uncrosslinked cationic functional group, and it is thus considered that the adhesion layer is low in crosslinking density and is not sufficient in heat resistance in the case of including the compound (A) and not including the crosslinking agent (B) as the component thereof. The adhesion layer is increased in crosslinking density and has high heat resistance due to formation of a covalent bond by a reaction of the cationic functional group of the compound (A) with the carboxy group of the crosslinking agent (B).

(Polar Solvent (D))

The solution for formation of the adhesion layer in the stacked substrates body of the embodiment, for example, the solution containing the compound (A), the solution containing the crosslinking agent (B), or the solution containing the compound (A) and the crosslinking agent (B), for use in the method of manufacturing the stacked substrates body described below, preferably contains a polar solvent (D). The polar solvent (D) here refers to a solvent having a relative dielectric constant of 5 or more at room temperature. Specific examples of the polar solvent (D) include a protonic inorganic compound such as water or heavy water; an alcohol such as methanol, ethanol, 1-propanol, 2-propanol, 1-butanol, 2-butanol, isobutyl alcohol, isopentyl alcohol, cyclohexanol, ethylene glycol, propylene glycol, 2-methoxyethanol, 2-ethoxyethanol, benzyl alcohol, diethylene glycol, triethylene glycol, or glycerin; an ether such as tetrahydrofuran or dimethoxyethane; an aldehyde or ketone such as furfural, acetone, ethyl methyl ketone, or cyclohexane; an acid derivative such as acetic anhydride, ethyl acetate, butyl acetate, ethylene carbonate, propylene carbonate, formaldehyde, N-methylformamide, N,N-dimethylformamide, N-methylacetamide, N,N-dimethylacetamide, N-methyl-2-pyrrolidone, or hexamethylphosphoramide; a nitrile such as acetonitrile or propionitrile; a nitro compound such as nitromethane or nitrobenzene; and a sulfur compound such as dimethylsulfoxide. The polar solvent (D) preferably contains a protonic solvent, more preferably water, further preferably ultrapure water.

The content of the polar solvent (D) in the solution for formation of the adhesion layer is not particularly limited, and is, for example, from 1.0% by mass to 99.99896% by mass, preferably from 40% by mass to 99.99896% by mass, with respect to the total solution.

The boiling point of the polar solvent (D) is preferably 150° C. or less, more preferably 120° C. or less, from the viewpoint that the polar solvent (D) is volatilized by heating in formation of the adhesion layer and thus the amount of the remaining solvent in the adhesion layer is reduced.

(Additive (C))

The solution for formation of the adhesion layer in the stacked substrates body of the embodiment may contain an additive (C), in addition to the above compound (A), the crosslinking agent (B) and the polar solvent (D). Examples of the additive (C) include an acid (C-1) having a carboxy group and having a weight average molecular weight of from 46 to 195, and a base (C-2) having a nitrogen atom, having a weight average molecular weight of from 17 to 120, and not having any ring structure. While the additive (C) is volatilized by heating in formation of the adhesion layer, the adhesion layer in the stacked substrates body of the embodiment may contain such an additive (C).

The acid (C-1) is an acid having a carboxy group and having a weight average molecular weight of from 46 to 195. It is presumed that the acid (C-1) is contained in the additive (C), whereby ionic bonding formed from an amino group in the compound (A) and a carboxy group in the acid (C-1) inhibits aggregation due to association of the compound (A) with the crosslinking agent (B). More specifically, it is presumed that the interaction (for example, electrostatic interaction) between an ammonium ion derived from an amino group in the compound (A) and a carboxylate ion derived from a carboxy group in the acid (C-1) is stronger than the interaction between an ammonium ion derived from an amino group in the compound (A) and a carboxylate ion derived from a carboxy group in the crosslinking agent (B), whereby such aggregation is inhibited. The invention is not limited to such presumptions at all.

The acid (C-1) is not particularly limited as long as the acid is a compound which has a carboxy group and which has a weight average molecular weight of from 46 to 195, and examples thereof include a monocarboxylic acid compound, a dicarboxylic acid compound, and an oxydicarboxylic acid compound. More specific examples of the acid (C-1) include formic acid, acetic acid, malonic acid, oxalic acid, citric acid, benzoic acid, lactic acid, glycolic acid, glyceric acid, butyric acid, methoxyacetic acid, ethoxyacetic acid, phthalic acid, terephthalic acid, picolinic acid, salicylic acid, and 3,4,5-trihydroxybenzoic acid.

In the embodiment, the content of the acid (C-1) in the solution for formation of the adhesion layer in the stacked substrates body is not particularly limited, and, for example, the ratio (COOH/N) of the number of carboxy groups in the acid (C-1) to the total number of nitrogen atoms in the compound (A) is preferably from 0.01 to 10, more preferably from 0.02 to 6, further preferably from 0.5 to 3.

The base (C-2) is a base having a nitrogen atom and having a weight average molecular weight of from 17 to 120. It is presumed that the solution for formation of the adhesion layer in the stacked substrates body of the embodiment contains the base (C-2) in the additive (C), whereby ionic bonding formed from a carboxy group in the crosslinking agent (B) and an amino group in the base (C-2) inhibits aggregation due to association of the compound (A) with the crosslinking agent (B). More specifically, it is presumed that the interaction between a carboxylate ion derived from a carboxy group in the crosslinking agent (B) and an ammonium ion derived from an amino group in the base (C-2) is stronger than the interaction between an ammonium ion derived from an amino group in the compound (A) and a carboxylate ion derived from a carboxy group in the crosslinking agent (B), whereby such aggregation is inhibited. The invention is not limited to such presumptions at all.

The base (C-2) is not particularly limited as long as the base is a compound having a nitrogen atom and having a weight average molecular weight of from 17 to 120, and not having any ring structure, and examples thereof include a monoamine compound and a diamine compound. More specific examples of the base (C-2) include ammonia, ethylamine, ethanolamine, diethylamine, triethylamine, ethylenediamine, N-acetylethylenediamine, N-(2-aminoethyl)ethanolamine, and N-(2-aminoethyl)glycine.

In the embodiment, the content of the base (C-2) in the solution for formation of the adhesion layer in the stacked substrates body is not particularly limited, and, for example, the ratio (N/COOH) of the number of nitrogen atoms in the base (C-2) to the number of carboxy groups in the crosslinking agent (B) is preferably from 0.5 to 5, more preferably from 0.9 to 3.

(Other Components)

The respective contents of sodium and potassium in the adhesion layer in the stacked substrates body of the embodiment are preferably 10 mass ppb or less on an element basis. In a case in which the respective contents of sodium and potassium are 10 mass ppb or less on an element basis, the occurrence of inconvenience in electrical characteristics of a semiconductor device, such as malfunction of a transistor, can be suppressed.

In a case in which the adhesion layer of the stacked substrates body of the embodiment is required to have insulation, tetraethoxysilane, tetramethoxysilane, bistriethoxysilylethane, bistriethoxysilylmethane, bis(methyldiethoxysilyl)ethane, 1,1,3,3,5,5-hexaethoxy-1,3,5-trisilacyclohexane, 1,3,5,7-tetramethyl-1,3,5,7-tetrahydroxylcyclosiloxane, 1,1,4,4-tetramethyl-1,4-diethoxydisylethylene, 1,3,5-triethoxy-1,3,5-trimethyl-1,3,5-trisilacyclohexane, or a siloxane polymer thereof may be mixed therewith, in order to improve insulation or mechanical strength. Furthermore, methyltriethoxysilane, dimethyldiethoxysilane, trimethylethoxysilane, or the like may be mixed therewith in order to improve hydrophobicity of an adhesion layer having insulation. Such a compound may also be mixed for control of etching selectivity.

The solution for formation of the adhesion layer in the stacked substrates body may contain any solvent other than the polar solvent (D), and examples of such any other solvent include normal hexane.

The solution for formation of the adhesion layer in the stacked substrates body may contain phthalic acid, benzoic acid or the like, or a derivative thereof, for example, in order to improve electrical characteristics.

The solution for formation of the adhesion layer in the stacked substrates body may contain benzotriazole or a derivative thereof, for example, in order to suppress corrosion of copper.

The pH of the solution for formation of the adhesion layer in the stacked substrates body is not particularly limited, and is preferably from 2.0 to 12.0.

The adhesion layer in the stacked substrates body may a crosslinkable compound such as an epoxy compound, an isocyanate compound, and a polyvalent acrylate compound. The content of such a crosslinkable compound is preferably 5% by mass or less, more preferably 1% by mass or less, further preferably 0.1% by mass or less, with respect to the total mass of the adhesion layer, and particularly preferably, such a compound is not contained, from the viewpoint that the occurrence of any outgas is suppressed and heat resistance is enhanced.

[First Substrate and Second Substrate]

The stacked substrates body of the embodiment is obtained by layering the first substrate, the adhesion layer, and the second substrate in the listed order.

The respective materials of the first substrate and the second substrate are not particularly limited, and may be any materials commonly used. The respective materials of the first substrate and the second substrate may be the same as or different from each other. Each of the first substrate and the second substrate preferably includes at least one element selected from the group consisting of Si, Al, Ti, Zr, Hf, Fe, Ni, Cu, Ag, Au, Ga, Ge, Sn, Pd, As, Pt, Mg, In, Ta, and Nb, more preferably includes at least one element selected from the group consisting of Si, Ga, Ge, and As, and is further preferably semiconductor substrate including at least one element selected from the group consisting of Si, Ga, Ge, and As. Examples of the respective materials of the first substrate and the second substrate include a semiconductor: Si, InP, GaN, GaAs, InGaAs, InGaAlAs, SiGe, SiC, oxide, carbide, or nitride: borosilicate glass (PYREX (registered trade mark)), quartz glass ($SiO_2$), sapphire ($Al_2O_3$), $ZrO_2$, $Si_3N_4$, AlN, $MgAl_2O_4$, a piezoelectric body, a dielectric body: $BaTiO_3$, $LiNbO_3$, $SrTiO_3$, $LiTaO_3$, diamond, and metal: Al, Ti, Fe, Cu, Ag, Au, Pt, Pd, Ta, or Nb.

Other respective materials of the first substrate and the second substrate may be a resin: polydimethylsiloxane (PDMS), an epoxy resin, a phenol resin, polyimide, a benzocyclobutene resin, polybenzoxazole, or the like.

Such respective materials are used in the followings as main applications.

Si is used in a semiconductor memory. LSI layering, a CMOS image sensor, MEMS sealing, an optical device, a LED, or the like;

$SiO_2$ is used in a semiconductor memory, LSI layering, MEMS sealing, microfluidics, a CMOS image sensor, an optical device, LED, or the like;

$BaTiO_3$. $LiNbO_3$, $SrTiO_3$, and $LiTaO_3$ are used in a surface acoustic wave device;

PDMS is used in microfluidics;

InGaAlAs, InGaAs, and InP are used in an optical device; InGaAlAs, GaAs, and GaN are used in LED, or the like.

A surface of at least one of the first substrate or the second substrate for use in manufacturing of the stacked substrates body on which the adhesion layer is to be formed, preferably, surfaces of the first substrate and the second substrate, on which the adhesion layer is to be formed, preferably have at least one selected from the group consisting of a hydroxyl group, an epoxy group, a carboxy group, an amino group, and a mercapto group. Thus, bonding strength between the substrates can be enhanced.

A hydroxyl group can be provided on such each surface of the first substrate and the second substrate by performing a surface treatment such as a plasma treatment, a chemical treatment, or an ozone treatment.

An epoxy group can be provided on such each surface of the first substrate and the second substrate by performing a surface treatment such as silane coupling with epoxysilane.

A carboxy group can be provided on such each surface of the first substrate and the second substrate by performing a surface treatment such as silane coupling with carboxysilane.

An amino group can be provided on such each surface of the first substrate and the second substrate by performing a surface treatment such as silane coupling with aminosilane.

At least one selected from the group consisting of a hydroxyl group, an epoxy group, a carboxy group, an amino group, and a mercapto group is preferably present in the state of being bonded to at least one element selected from the group consisting of Si, Al, Ti, Zr, Hf, Fe, Ni, Cu, Ag, Au, Ga, Ge, Sn, Pd, As, Pt, Mg, In, Ta, and Nb contained in the first substrate or the second substrate. In particular, a surface of at least one of the first substrate or the second substrate, on which the adhesion layer is to be formed, more preferably has a silanol group (Si—OH group) containing a hydroxyl group.

At least one of the first substrate or the second substrate may be provided with an electrode on a surface thereof, the surface being closer to the adhesion layer.

The thicknesses of the first substrate and the second substrate are each independently preferably from 1 μm to 1 mm, more preferably from 2 μm to 900 μm.

The respective shapes of the first substrate and the second substrate are not particularly limited. For example, in a case in which the first substrate and the second substrate are each a silicon substrate, such a silicon substrate may be a silicon substrate on which an interlayer insulating layer (Low-k film) is formed, or a silicon substrate on which fine grooves (recesses), fine through holes, or the like are formed.

In the stacked substrates body of the embodiment, still another substrate may be layered on a surface of at least one of the first substrate or the second substrate, the surface being located opposite to the surface closer to the adhesion layer. A preferable material of such another substrate is the same as preferable respective materials of the first substrate and the second substrate. The material of such another substrate may be the same as or different from that of at least one of the first substrate or the second substrate.

(Examples of the Stacked Structure of the Stacked Substrates Body)

Hereinafter, examples of the stacked structure of the stacked substrates body in each application are shown.

For MEMS packaging: Si/adhesion layer/Si, $SiO_2$/adhesion layer/Si, $SiO_2$/adhesion layer/$SiO_2$, Cu/adhesion layer/Cu, For microfluidics; PDMS/adhesion layer/PDMS, PDMS/adhesion layer/$SiO_2$, For CMOS image sensor; $SiO_2$/adhesion layer/$SiO_2$, Si/adhesion layer/Si, $SiO_2$/adhesion layer/Si, For silicon through via (TSV); $SiO_2$ (provided with Cu electrode)/adhesion layer/$SiO_2$ (provided with Cu electrode), For memory and LSI; $SiO_2$/adhesion layer/$SiO_2$, For optical device; (InGaAlAs, InGaAs, InP, GaAs)/adhesion layer/Si, For LED; (InGaAlAs, GaAs, GaN)/adhesion layer/Si, (InGaAlAs, GaAs, GaN)/adhesion layer/$SiO_2$, (InGaAlAs, GaAs, GaN)/adhesion layer/(Au, Ag, Al), InGaAlAs, GaAs, GaN)/adhesion layer/sapphire For surface acoustic wave device; ($BaTiO_3$, $LiNbO_3$, $SrTiO_3$, $LiTaO_3$)/adhesion layer/($MgAl_2O_4$, $SiO_2$, Si, $Al_2O_3$)).

A higher tensile bonding strength of the stacked substrates body in the embodiment is more preferable from the viewpoint of suppression of unintended releasing in a semiconductor process and from the viewpoint of reliability. Specifically, the tensile bonding strength of the stacked substrates body is preferably 5 MPa or more, more preferably 10 MPa or more. The tensile bonding strength of the stacked substrates body can be determined from a yield point obtained in measurement with a tensile tester. The tensile bonding strength may be 200 MPa or less, or may be 100 MPa or less.

The stacked substrates body of the embodiment preferably has a tensile bonding strength of 5 MPa or more and a thickness of the adhesion layer of from 0.1 nm to 5000 nm, more preferably a tensile bonding strength of 5 MPa or more and a thickness of the adhesion layer of from 0.5 nm to 3000 nm, further preferably a tensile bonding strength of 10 MPa or more and a thickness of the adhesion layer of from 5 nm to 2000 nm, particularly preferably a tensile bonding strength of 10 MPa or more and a thickness of the adhesion layer of from 5 nm to 500 nm.

The temperature at which the pressure of outgas reaches $2\times10^{-6}$ Pa in the stacked substrates body of the embodiment is preferably 400° C. or more, more preferably 420° C. or more, further preferably 440° C. or more from the viewpoint of suppression of a reduction in bonding strength of the stacked substrates body due to outgas. The temperature at which the pressure of outgas reaches $2\times10^{-6}$ Pa is a value obtained by measurement under a reduced pressure environment. Such a reduced pressure environment is at $10^{-7}$ Pa. The temperature at which the pressure of outgas reaches $2\times10^{-6}$ Pa may be 600° C. or less or may be 550° C. or less.

The rate of the total void area in the stacked substrates body of the embodiment (void area ratio) is preferably 30% or less, more preferably 20% or less, further preferably 10% or less. The void area ratio is a value calculated by dividing the total void area by the total area where transmitted light is observable, and multiplying the quotient by 100, in infrared light transmission observation. In a case where such infrared light transmission observation is difficult to perform, such a value can be determined in the same procedure by use of reflected wave in an ultrasonic microscope, transmitted wave in an ultrasonic microscope, or reflected light of infrared light, preferably by use of reflected wave in an ultrasonic microscope.

(Method of Manufacturing Stacked Substrates Body)

Hereinafter, a method of manufacturing a stacked substrates body of one embodiment of the invention will be described. Examples of the method of manufacturing a stacked substrates body of the embodiment include a first manufacturing method and a second manufacturing method, described below. The method of manufacturing a stacked substrates body of the invention is not limited to such methods.

(First Manufacturing Method)

A first method of manufacturing a stacked substrates body includes a first step of forming a film including a compound (A) which has a cationic functional group containing at least one of a primary nitrogen atom or a secondary nitrogen atom and which has a weight average molecular weight of from 90 to 400000, on a first substrate, a second step of providing a crosslinking agent (B) which has three or more —C(=O)OX groups (X is a hydrogen atom or an alkyl group having from 1 to 6 carbon atoms) in a molecule, in which from one to six of the three or more —C(=O)OX groups are —C(=O)OH groups and which has a weight average molecular weight of from 200 to 600, onto the film, a third step of layering a second substrate on a surface on which a film including the compound (A) and the crosslinking agent (B) is formed, and a heating step of heating the film including the compound (A) and the crosslinking agent (B) to a temperature of from 70° C. to 450° C., thereby forming an adhesion layer including a reaction product of the compound (A) and the crosslinking agent (B).

The compound (A) preferably includes at least one selected from the group consisting of an aliphatic amine having a weight average molecular weight of from 10000 to 400000 and a compound having a siloxane bond (Si—O bond) and an amino group and having a weight average molecular weight of from 130 to 10000.

Hereinafter, each of the steps of the first method of manufacturing a stacked substrates body will be described.

<First Step>

Examples of the method of forming the film including the compound (A) on the first substrate include a method of forming the film including the compound (A) on the substrate by use of a solution containing the compound (A). The method of forming the film is not particularly limited, and a method commonly used may be adopted.

Examples of such a method commonly used include a dipping method, a spraying method, a spin coating method, and a bar coating method. For example, a bar coating method is preferably used in the case of formation of a film having a micrometer-sized thickness, and a spraying method is preferably used in the case of a film having a nanometer-sized thickness (from several nm to several hundred nm).

For example, the method of forming the film including the compound (A) by a spin coating method is not particularly limited, and, for example, a method can be used which includes dropping the solution containing the compound (A) onto a surface of the first substrate with rotation of the substrate by a spin coater, and thereafter increasing the number of revolutions of the first substrate for drying.

Various conditions of the method of forming the film including the compound (A) by a spin coating method, for example, the number of revolutions of the substrate, the amount and the time of dropping of the solution containing the compound (A), and the number of revolutions of the substrate in drying, are not particularly limited, and may be appropriately adjusted in consideration of the thickness of a film to be formed.

<Drying Step>

The first method of manufacturing a stacked substrates body may include a drying step of drying the first substrate on which the film including the compound (A) is formed, in a condition of a temperature of from 70° C. to 250° C. The temperature here refers to the temperature of a surface of the first substrate, on which the film including the compound (A) is formed.

In particular, in a case in which Cu and $SiO_2$ are present in a surface of the first substrate, the surface being closer to the adhesion layer, the method can include the drying step, thereby allowing both the difficulty of remaining of a polymer on Cu and the ease of remaining of a polymer on $SiO_2$ to be more effectively satisfied.

Specifically, the temperature is 70° C. or more, whereby the remaining ability of a polymer provided to $SiO_2$ is suitably maintained. The temperature is 250° C. or less, whereby a polymer can further hardly remain on Cu.

The temperature is more preferably from 80° C. to 200° C., more preferably from 85° C. to 170° C., further preferably from 90° C. to 150° C.

The drying in the drying step can be performed by a common method, and can be performed using, for example, a hot plate.

The atmosphere where the drying is performed is not particularly limited, and may be performed, for example, under an air atmosphere or under an atmosphere of an inert gas (nitrogen gas, argon gas, helium gas, or the like).

The drying time is not particularly limited, and is preferably 300 seconds or less, more preferably 200 seconds or less, further preferably 120 seconds or less, particularly preferably 80 seconds or less.

The lower limit of the drying time is not particularly limited, and the lower limit can be, for example, 10 seconds, preferably 20 seconds, more preferably 30 seconds.

<Washing Step>

The first method of manufacturing a stacked substrates body may include a washing step of washing the first substrate on which the film including the compound (A) is formed, with a polar solvent or the like in order to remove an excess of the compound (A) provided to the first substrate. In a case in which the first method of manufacturing a stacked substrates body includes the drying step, it is preferable that the washing step is performed after the drying step, and it is more preferable that the washing step is performed after the drying step and after the second step.

<Second Step>

Examples of the method of providing the crosslinking agent (B) onto the film including the compound (A) include a method of providing the crosslinking agent (B) onto the film including the compound (A) by use of a solution containing the crosslinking agent (B). In a case in which the solution containing the crosslinking agent (B) is used, the crosslinking agent (B) can be provided onto the film including the compound (A) in the same manner as the method described in the first step.

The first step, the drying step, the second step, and the washing step may be, if necessary, further repeated after the second step, depending on the thickness of the adhesion layer to be formed.

<Third Step>

A second substrate is layered on a surface on which the film including the compound (A) and the crosslinking agent (B) is formed, after the second step or after a heating step described below. Thus, a stacked substrates body where the first substrate, the film including the compound (A) and the crosslinking agent (B), and the second substrate are sequentially layered is obtained. The film including the compound (A) and the crosslinking agent (B) may be formed in advance on a surface of the second substrate, the surface being closer to the first substrate, before the third step, from the viewpoint of a more enhancement in bonding strength.

The pressure at which the layering in the third step is performed is not particularly limited, and the layering is preferably performed at an absolute pressure of higher than $10^{-4}$ Pa and equal to or lower than the atmospheric pressure.

The absolute pressure is more preferably from $10^{-3}$ Pa to the atmospheric pressure, further preferably from 100 Pa to the atmospheric pressure, particularly preferably from 1000 Pa to the atmospheric pressure.

The layering in such a layering step may be performed under an air atmosphere or under an atmosphere of an inert gas (nitrogen gas, argon gas, helium gas, or the like).

<Heating Step>

The first method of manufacturing a stacked substrates body includes a heating step of heating the film including the compound (A) and the crosslinking agent (B) at a temperature of from 70° C. to 450° C., after the second step.

The temperature here refers to the temperature of a surface of the first substrate or the second substrate, on which the film including the compound (A) and the crosslinking agent (B) is formed.

Since the method includes a heating step, the solvent contained in the film including the compound (A) and the crosslinking agent (B) is removed, and the compound (A) and the crosslinking agent (B) react with each other due to heating, and form a reaction product, whereby a film including the reaction product is formed.

The temperature is preferably from 100° C. to 450° C., more preferably from 100° C. to 430° C., further preferably from 150° C. to 420° C. The temperature may be from 70° C. to 250° C., may be from 80° C. to 200° C., may be from 85° C. to 170° C., or may be from 90° C. to 150° C.

The pressure in heating to be performed in the heating step is not particularly limited, and is preferably an absolute pressure of higher than 17 Pa and equal to or lower than the atmospheric pressure.

The absolute pressure is more preferably from 1000 Pa to the atmospheric pressure, further preferably from 5000 Pa to the atmospheric pressure, particularly preferably from 10000 Pa to the atmospheric pressure.

The heating in the heating step can be performed by a common method using a furnace or a hot plate. Such a furnace that can be used is, for example, SPX-1120 manufactured by APPEX CORPORATION or VF-1000 LP manufactured by Koyo Thermo Systems Co., Ltd.

The heating in the heating step may be performed under an air atmosphere or under an atmosphere of an inert gas (nitrogen gas, argon gas, helium gas, or the like).

The heating time in the heating step is not particularly limited, and is, for example, 3 hours or less, preferably 1 hour or less. The lower limit of the heating time is not particularly limited, and, for example, can be 5 minutes, can be 3 minutes, or can be 30 seconds.

In a case in which the film including the compound (A) and the crosslinking agent (B) is heated at from 70° C. to 250° C., the heating time may be 300 seconds or less, may be 200 seconds or less, may be 120 seconds or less, or may be 80 seconds or less. The lower limit of the heating time here can be, for example, 10 seconds, preferably 20 seconds, more preferably 30 seconds.

The heating step may include a step of heating the film including the compound (A) and the crosslinking agent (B) at from 70° C. to 250° C. as described above (low-temperature heating step) and a step of heating the film at from 100° C. to 450° C. (high-temperature heating step where heating is made at a higher temperature than that in the low-temperature heating step).

A surface of the first substrate, on which the film including the compound (A) and the crosslinking agent (B) is formed, may be irradiated with ultraviolet light for the purpose of a decrease in the time of the heating step. Such ultraviolet light is preferably ultraviolet light having a wavelength of from 170 nm to 230 nm, excimer light having a wavelength of 222 nm, excimer light having a wavelength of 172 nm, or the like. Such irradiation with ultraviolet light is preferably performed under an inert gas atmosphere.

The heating step may be any step to be performed after the second step, or may be performed after the drying step or the washing step, if necessary, performed. The heating step may be performed before the third step, may be performed after the third step, or may be performed both before and after the third step.

A stacked substrates body may be pressed at the same time as the heating in the heating step performed after the third step. Here, a heating step of performing the heating and the pressing may be performed after the third step, or the heating step and the third step may be performed in any order after the second step and thereafter such a heating step of performing the heating and the pressing may be further performed.

The pressing pressure in the heating step of performing the heating and the pressing is preferably from 0.1 MPa to 50 MPa, more preferably from 0.1 MPa to 10 MPa, further preferably from 0.1 MPa to 5 MPa. The pressing apparatus that may be here used is, for example, TEST MINI PRESS manufactured by Toyo Seiki Seisaku-sho, Ltd.

The heating temperature in the heating step of performing the heating and the pressing is preferably from 100° C. to 450° C., more preferably from 100° C. to 400° C., further preferably from 150° C. to 350° C. Thus, in a case in which a semiconductor circuit is formed on a substrate, any damage on the semiconductor circuit tends to be suppressed.

<Pressurizing Step>

The first method of manufacturing a stacked substrates body may include a pressurizing step of pressing a stacked substrates body, after the third step, preferably after the third step and after the heating step. The pressing pressure in the pressurizing step is preferably from 0.1 MPa to 50 MPa, more preferably from 0.1 MPa to 10 MPa. The pressing apparatus that may be here used is, for example TEST MINI PRESS manufactured by Toyo Seiki Seisaku-sho, Ltd. The pressurizing time is not particularly limited, and can be, for example, from 0.5 seconds to 1 hour.

The temperature in the pressurizing step is preferably 10° C. or more but less than 100° C., more preferably from 10° C. to 70° C., further preferably from 15° C. to 50° C., particularly preferably from 20° C. to 30° C.

The temperature here refers to the temperature of a surface of the first substrate or the second substrate, on which the film including the compound (A) and the crosslinking agent (B) is formed.

It is preferable to press a stacked substrates body in at least one of the heating step or the pressurizing step in the first method of manufacturing a stacked substrates body. Such pressing of a stacked substrates body tends to allow for an increase in adhesion area and impart a more excellent bonding strength. The conditions in the pressing are as described above.

<Post-Heating Step>

The first method of manufacturing a stacked substrates body may include a post-heating step of heating the stacked substrates body, after the pressurizing step.

The method includes the pressurizing step and the post-heating step, whereby bonding strength tends to be more excellent.

Hereinafter, preferable conditions in the post-heating step will be described. Herein, description of items common to the heating step is omitted.

The heating temperature in the post-heating step is preferably from 100° C. to 450° C., more preferably from 150° C. to 420° C., further preferably from 150° C. to 400° C. The heating in the post-heating step is preferably performed at an absolute pressure of higher than 17 Pa and equal to or lower than the atmospheric pressure.

The absolute pressure is more preferably from 1000 Pa to the atmospheric pressure, further preferably from 5000 Pa to the atmospheric pressure, particularly preferably from 10000 Pa to the atmospheric pressure.

It is preferable not to perform any pressing of the stacked substrates body in the post-heating step.

(Second Manufacturing Method)

A second method of manufacturing a stacked substrates body includes a fifth step of forming a film including a compound (A) which has a cationic functional group containing at least one of a primary nitrogen atom or a secondary nitrogen atom and which has a weight average molecular weight of from 90 to 400000 and a crosslinking agent (B) which has three or more —C(=O)OX groups (X is a hydrogen atom or an alkyl group having from 1 to 6 carbon atoms) in a molecule, in which from one to six of the three or more —C(=O)OX groups are —C(=O)OH groups and which has a weight average molecular weight of from 200 to 600, on a first substrate, a sixth step of layering a second substrate on a surface where the film including the compound (A) and the crosslinking agent (B) is formed, and a heating step of heating the film including the compound (A) and the crosslinking agent (B) to a temperature of from 70° C. to 450° C., thereby forming an adhesion layer including a reaction product of the compound (A) and the crosslinking agent (B).

The compound (A) preferably includes at least one selected from the group consisting of an aliphatic amine having a weight average molecular weight of from 10000 to 400000 and a compound having a siloxane bond (Si—O bond) and an amino group and having a weight average molecular weight of from 130 to 10000.

<Fifth Step>

Examples of the method of forming the film including the compound (A) and the crosslinking agent (B), on the first substrate, include a method of forming the film including the compound (A) and the crosslinking agent (B), on the first substrate, by use of a solution containing the compound (A) and the crosslinking agent (B). The solution containing the compound (A) and the crosslinking agent (B) may be prepared by mixing the compound (A) and the crosslinking agent (B). The film including the compound (A) and the crosslinking agent (B) may be formed on the first substrate by the same method as the method described in the first step.

The second manufacturing method may, if necessary, undergo the drying step and the washing step after the fifth step, as in the first manufacturing method.

<Sixth Step>

A second substrate is layered on a surface on which the film including the compound (A) and the crosslinking agent (B) is provided. The sixth step may be performed by the same method as that in the third step.

<Heating Step>

The second method of manufacturing a stacked substrates body includes a heating step of heating the film including the compound (A) and the crosslinking agent (B) at from 70° C. to 450° C., after the fifth step.

The method includes the heating step, thereby allowing the compound (A) and the crosslinking agent (B) to react with each other due to heating, thereby providing a reaction product and then forming an adhesion layer as a film including the reaction product.

The heating step in the second manufacturing method may be performed by the same method as that in the heating step in the first manufacturing method.

The second manufacturing method may include a pressurizing step of pressing a stacked substrates body, after the sixth step, preferably after the sixth step and after the heating step. The pressurizing step in the second manufacturing method may be performed by the same method as that in the pressurizing step in the first manufacturing method.

The second manufacturing method may include a post-heating step of heating the stacked substrates body, after the pressurizing step. The post-heating step in the second manufacturing method may be performed by the same method as that in the post-heating step in the first manufacturing method.

It is preferable in the first manufacturing method and the second manufacturing method that the solution for formation of the adhesion layer, namely, the solution containing the compound (A), the solution containing the crosslinking agent (B), or the solution containing the compound (A) and the crosslinking agent (B), preferably contains a polar solvent (D). The polar solvent (D) may be added to the compound (A), the crosslinking agent (B), or a mixture of the compound (A) and the crosslinking agent (B) at any timing in production of the solution for formation of the adhesion layer. The timing at which other components are added is also not particularly limited.

The method includes a step of, for example, providing the solution containing the compound (A) on a surface of the first substrate, thereby forming the film including the compound (A) (first step), or a step of, for example, providing the solution containing the compound (A) and the crosslinking agent (B) on a surface of the first substrate, thereby forming the film including the compound (A) and the crosslinking agent (B) (fifth step). In a case in which the solution containing the compound (A), or the solution containing the compound (A) and the crosslinking agent (B) is provided on the first substrate, the content of the compound (A) in the solution containing the compound (A), or the content of the compound (A) in the solution containing the compound (A) and the crosslinking agent (B) is not particularly limited, and can be, for example, from 0.001% by mass to 30% by mass or less and is preferably from 0.01% by mass to 20% by mass or less, more preferably from 0.04% by mass to 20% by mass or less, with respect to the entire solution.

The method includes a step of, for example, forming the film including the compound (A) on a surface of the first substrate and thereafter providing the solution containing the crosslinking agent (B) on the film, thereby providing the crosslinking agent (B) on the film (second step), or a step of, for example, providing the solution containing the compound (A) and the crosslinking agent (B) on a surface of the first substrate, thereby forming the film including the compound (A) and the crosslinking agent (B) (fifth step). In a case in which the solution containing the crosslinking agent (B), or the solution containing the compound (A) and the crosslinking agent (B) is provided on the first substrate, the content of the crosslinking agent (B) in the solution containing the crosslinking agent (B), or the content of the crosslinking agent (B) in the solution containing the compound (A) and the crosslinking agent (B) is not particularly limited, and, for example, the ratio (COOH/N) of the number of carboxy groups in the crosslinking agent (B) to the number of all the nitrogen atoms in the compound (A) is preferably from 0.1 to 3.0, more preferably from 0.3 to 2.5, further preferably from 0.4 to 2.2. A ratio COOH/N of from 0.1 to 3.0 enables a thermally crosslinked structure such as amide, amide-imide, or imide to be easily formed in the heating step in the first manufacturing method and the second manufacturing method, and thus enables a film more excellent in heat resistance to be manufactured.

In the first manufacturing method and the second manufacturing method, at least one additive (C) selected from the group consisting of an acid (C-1) having a carboxy group and having a weight average molecular weight of from 46 to 195 and a base (C-2) having a nitrogen atom, having a weight average molecular weight of from 17 to 120, and not having any ring structure may be added to the compound (A) or the crosslinking agent (B). The timing at which the additive (C) is added is not particularly limited.

In a case in which the acid (C-1) is added as the additive (C) in the first manufacturing method, it is preferable to form a film including the acid (C-1) and the compound (A) in the first step and thereafter provide the crosslinking agent (B) onto the film in the second step. Thus, whitening and gelation of a composition can be suitably suppressed in mixing of the compound (A) and the crosslinking agent (B). It is herein preferable to suppress gelation from the viewpoint of making the thickness of the adhesion layer uniform.

In a case in which the acid (C-1) is added as the additive (C) in the second manufacturing method, it is preferable to mix a mixture of the acid (C-1) and the compound (A), with the crosslinking agent (B). In other words, it is preferable to mix the compound (A) and the acid (C-1) in advance before mixing of the compound (A) and the crosslinking agent (B). Thus, whitening and gelation of a composition (gelation is not preferable because any time may be taken for making the composition transparent) can be suitably suppressed in mixing of the compound (A) and the crosslinking agent (B).

In a case in which the base (C-2) is added as the additive (C) in the first manufacturing method, it is preferable to form a film including the compound (A) in the first step and thereafter provide a mixture of the crosslinking agent (B) and the base (C-2) onto the film in the second step. Thus, whitening and gelation of a composition can be suitably suppressed in mixing of the compound (A) and the crosslinking agent (B).

In a case in which the base (C-2) is added as the additive (C) in the second manufacturing method, it is preferable to mix a mixture of the base (C-2) and the crosslinking agent (B) with the compound (A). In other words, it is preferable to mix the crosslinking agent (B) and the base (C-2) in advance before mixing of the compound (A) and the crosslinking agent (B). Thus, whitening and gelation of a composition (gelation is not preferable because any time may be taken for making the composition transparent) can be suitably suppressed in mixing of the compound (A) and the crosslinking agent (B).

The first manufacturing method and the second manufacturing method tend to allow the thickness of the adhesion layer to be thinner and allow for a more enhancement in bonding strength as compared with, for example, a case in which the adhesion layer is formed by coating a substrate with polyamic acid.

EXAMPLES

Hereinafter, the invention will be more specifically described with reference to Examples, but the invention is not intended to be limited to these Examples.

Hereinafter, water was used in the case of no indication of any solvent.

Hereinafter, ultrapure water (MILLI-Q water manufactured by Millipore Corporation, resistance of 18 MΩ·cm (25° C.) or less) was used as "water".

Each solution for formation of the adhesion layer was prepared in Example 1 to Example 1 and Comparative Example 1 to Comparative Example 5. The details are as indicated below.

A solution of the compound (A), a solution of the crosslinking agent (B), a solution where the base (C-2) was added to the crosslinking agent (B), and other solution were each mixed after checking of no precipitate present in each of the solutions.

Example 1

A solution containing the compound (A) was obtained by adding 4.0 g of 3-aminopropyldiethoxymethylsilane (3APDES; (3-Aminopropyl)diethoxymethylsilane) prepared as the compound (A), to 56.0 g of 1-propanol (1PrOH), further adding 20.0 g of an aqueous 8.8% by mass formic acid (FA) solution for dissolution so that the concentration of 3APDES was 5% by mass, and stirring the resultant at room temperature for 1 hour and then warming it in a water bath at 60° C. for 1 hour, 3APDES was here present as a hydrolysate in the solution. The hydrolysate of 3APDES had a structure where one methyl group being a non-crosslinkable group, two hydroxyl groups being crosslinkable groups, and one aminopropyl group being a crosslinkable group were bound to Si. In other words, the (non-crosslinkable group)/Si was 1.

1-Propyl half ester trimellitic acid (1PrheTMA; 1-propyl half ester TMA) was prepared as the crosslinking agent (B), 1 PrheTMA was produced by adding trimellitic anhydride to 1-propanol, and completely dissolving a trimellitic anhydride powder.

Next, a solution 1 containing the compound (A), the crosslinking agent (B) and the acid (C-1) was prepared by mixing the solution containing the compound (A) and the solution containing the crosslinking agent (B) so that the concentration shown in Table 1 was achieved.

In Table 1, the concentration in parentheses with respect to 3APDES (2% by mass) represents the concentration of 3APDES in the solution containing the compound (A) and the crosslinking agent (B).

The numerical value in parentheses with respect to 1PrheTMA [1.03] represents the ratio (COOH/N) of the number of carboxy groups in 1PrheTMA as the crosslinking agent (B) to the number of all the nitrogen atoms in 3APDES as the compound (A).

The numerical value in parentheses with respect to FA, 1.83, represents the ratio (COOH/N) of the number of carboxy groups in FA as the acid (C-1) to the number of all the nitrogen atoms in 3APDES as the compound (A).

The concentration in parentheses with respect to 1 PrOH (86.6% by mass) represents the concentration of 1PrOH in the solution containing the compound (A) and the crosslinking agent (B).

Example 2

A solution 2 containing the compound (A), the crosslinking agent (B), and the acid (C-1) was prepared by preparing 2.0 g of the solution 1 produced in Example 1, and adding the solution to 12.0 g of 1PrOH and further adding 6.0 g of water.

In Table 1, the concentration in parentheses with respect to 3APDES (0.2% by mass) represents the concentration of 3APDES in the solution containing the compound (A) and the crosslinking agent (B).

The numerical value in parentheses with respect to 1PrheTMA [1.03] represents the ratio (COOH/N) of the number of carboxy groups in 1PrheTMA as the crosslinking agent (B) to the number of all the nitrogen atoms in 3APDES as the compound (A).

The numerical value in parentheses with respect to FA, 1.83, represents the ratio (COOH/N) of the number of carboxy groups in FA as the acid (C-1) to the number of all the nitrogen atoms in 3APDES as the compound (A).

The concentration in parentheses with respect to 1PrOH (68.6% by mass) represents the concentration of 1PrOH in the solution containing the compound (A) and the crosslinking agent (B).

Example 3

Polyethyleneimine (Mw=70,000, primary nitrogen atom/secondary nitrogen atom/tertiary nitrogen atom=31/40/29) being a branched polyethyleneimine (BPEI), manufactured by BASF SE, was prepared as the compound (A).

Production was made by adding 12.67 g of water to 7.0 g of trimellitic acid (TMA) as the crosslinking agent (B), and further adding 30.33 g of an aqueous 8.4% by mass ammonia ($NH_3$) solution for complete dissolution of TMA.

Next, the solution containing the compound (A) and the solution containing the crosslinking agent (B) were mixed so that the concentration shown in Table 1 was achieved, and a solution 3 containing the compound (A) and the crosslinking agent (B) was prepared.

In Table 1, the concentration in parentheses with respect to BPEI (0.15% by mass) represents the concentration of BPEI in the solution containing the compound (A) and the crosslinking agent (B).

The numerical value in parentheses with respect to TMA [1.5] represents the ratio (COOH/N) of the number of carboxy groups in TMA as the crosslinking agent (B) to the number of all the nitrogen atoms in BPEI as the compound (A).

The numerical value in parentheses with respect to $NH_3$, 1.5, represents the ratio (N/COOH) of the number of all the nitrogen atoms in $NH_3$ as the base (C-2) to the number of carboxy groups in TMA as the crosslinking agent (B).

Example 4 to Example 11

Each of solutions 1 and 4 to 8 was prepared in the same manner as in Example 1 except that the components and the amounts thereof were changed as described in Table 1 in each of Examples 4 to 11.

In Table 1, the concentrations in parentheses of 3APDES, 3APTES, and BPEI, each serving as the compound (A), represent the concentrations of 3APDES, 3APTES, and BPEI in the solution containing the compound (A) and the crosslinking agent (B), respectively.

The numerical values in parentheses with respect to 1PrheTMA, TMA, ehePMA, PMA, and TMSA, each serving as the crosslinking agent (B), each represent the ratio (COOH/N) of the number of carboxy groups in the crosslinking agent (B) to the number of all the nitrogen atoms in the compound (A).

The numerical value in parentheses with respect to FA represents the ratio (COOH/N) of the number of carboxy groups in FA as the acid (C-1) to the number of all the nitrogen atoms in the compound (A).

The numerical value in parentheses with respect to $NH_3$ represents the ratio (N/COOH) of the number of all the nitrogen atoms in $NH_3$ as the base (C-2) to the number of carboxy groups in the crosslinking agent (B).

The concentrations in parentheses with respect to 1 PrOH and EtOH represent the concentrations of 1PrOH and EtOH in the solution containing the compound (A) and the crosslinking agent (B), respectively.

Abbreviations of the compound (A), the crosslinking agent (B), the acid (C-1), the base (C-2), and the polar solvent (D) in Table 1 and Table 2 are as follows. 3APDES was hydrolyzed in the solution as described above. 3APTES was also hydrolyzed in the solution, and the hydrolysate of 3APTES had a structure where no non-crosslinkable group was present on Si, and three hydroxyl groups being crosslinkable groups and one aminopropyl group being a crosslinkable group were bound to Si. In other words, the (non-crosslinkable group)/Si was 0.

<Compound (A)>
3 APDES: 3-aminopropyldiethoxymethylsilane (hydrolyzed in solution)
3APTES: 3-aminopropyltriethoxysilane (hydrolyzed in solution)
BPEI: branched polyethyleneimine
<Crosslinking Agent (B)>
1 PrheTMA: 1-propyl half ester trimellitic acid
TMA: trimellitic acid
ehePMA: ethyl half ester pyromellitic acid
PMA: pyromellitic acid
TMSA: 1,3,5-benzenetricarboxylic acid
<Acid (C-1)>
FA: formic acid
<Base (C-2)>
$NH_3$: ammonia
<Polar Solvent (DP)
1PrOH: 1-propanol
EtOH: ethanol Comparative Example 1 to Comparative Example 5

Solutions 9 to 13 were prepared in the same manner as in Example 1 except that the components and the amounts thereof were changed as described in Table 2 in Comparative Examples 1 to 5, respectively.

In Comparative Example 1, biphenyltetracarboxylic acid dianhydride (BPDA) and para-phenylenediamine (pDA) were allowed to react with each other in an N-methyl-2-pyrrolidone (NMP) solvent (97.5% by mass), thereby preparing a solution 9 containing polyamic acid (2.5% by mass) made of BPDA and pDA.

In Comparative Example 2, p-xylenediamine (pXDA) was dissolved in a mixed solvent of water and 1-propanol (1 PrOH) and thereafter left to still stand overnight, thereby providing a pXDA solution 1. Ammonia ($NH_3$) and water were mixed with 1,3,5-benzenetricarboxylic acid (TMSA), thereby providing a mixed solution 1 of TMSA and $NH_3$. Next, the pXDA solution 1, the mixed solution 1 of TMSA and $NH_3$, and water were mixed so that the concentration shown in Table 2 was achieved, thereby preparing a solution 10.

In Comparative Example 3 and Comparative Example 4, BPEI and 3APDES were used for mixing with water so that the concentrations in parentheses were achieved, and MA was mixed with each of the resulting solutions so that the ratios (COOH/N) of the numbers of carboxy groups in malonic acid (MA) to the numbers of all the nitrogen atoms in BPEI and 3APDES corresponded to a numerical value in parentheses of 1.0, thereby preparing a solution 11 and a solution 12, respectively.

In Comparative Example 5, a solution containing a hydrolysate of tetraethoxysilane (TEOS) and a siloxane polymer in a mixture of ethanol, water and nitric acid was obtained according to the A2** method described in THE JOURNAL OF PHYSICAL CHEMISTRY C (2011), vol. 115, pages 12981-12989, and thereafter water, ethanol, and 1-propanol were added so as to be in amounts of numerical numbers in parentheses, thereby preparing a solution 13.

The concentrations in parentheses with respect to 1 PrOH, EtOH, and nitric acid represent the concentrations of 1PrOH, EtOH, and nitric acid in the solution, respectively.

<Formation of Adhesion Layer>

A silicon substrate having a diameter of 4 inches (silicon wafer) was prepared as a substrate to be coated with the resulting solution containing the compound (A) and the crosslinking agent (B). After the silicon substrate was treated with UV (ultraviolet) ozone for 5 minutes, the silicon substrate was placed on a spin coater, 2.0 mL of the composition prepared in each of Examples and each of Comparative Examples was dropped thereon at a constant speed for 10 seconds and held for 13 seconds, and thereafter the resultant was rotated at 2000 rpm (rpm meaning the rotational speed) for 1 second and at 600 rpm for 30 seconds, and then rotated at 2000 rpm for 10 seconds for drying. Thus, an adhesion layer was formed on the silicon substrate.

Next, the adhesion layer was heated and dried at 125° C. for 1 minute in the heating step (low-temperature heating step).

Each of the resulting adhesion layers of Examples and Comparative Examples was evaluated with respect to the thickness of each of the adhesion layers, the crosslinked structure, the surface smoothness, and the thickness uniformity in wafer.

(Measurement of Thickness of Adhesion Layer)

The thickness of each of the adhesion layers was measured with an ellipsometer (optical porosimeter (PS-1100) manufactured by manufactured by SEMILAB JAPAN K.K.). In the case of a thickness of 10 nm or more, fitting was performed with an optical model of air/(Cauchy+Lorenz oscillator model)/natural oxide film/silicon substrate. In the case of a thickness of less than 10 nm, fitting was performed with an optical model of air/$SiO_2$/natural oxide film/silicon substrate. The results are shown in Table 1 and Table 2.

(Confirmation of Crosslinked Structure)

The crosslinked structure of each of the adhesion layers was measured by FT-IR (Fourier transform infrared spectroscopy). The analyzer used was as follows.

—FT-IR Analyzer—

Infrared absorption analyzer (DIGILAB Excalibur (manufactured by Digilab Inc.))

—Measurement Conditions—

IR source: air-cooled ceramic.
Beam splitter: wide range KBr,
Detector: Peltier cooling DTGS,
Measurement wavenumber range: from 7500 $cm^{-1}$ to 400 $cm^{-1}$,
Resolution: 4 $cm^{-1}$,
Integration times: 256,
Background: use of Si bare wafer,
Measurement atmosphere: $N_2$ (10 L/min),
Incident angle of IR (infrared): 72° (=Brewster angle of Si)

—Determination Conditions—

An imide bond was determined by the presence of vibration peaks at 1770 $cm^{-1}$ and 1720 $cm^{-1}$. An amide bond was determined by the presence of vibration peaks at 1650 $cm^{-1}$ and 1550 $cm^{-1}$. A siloxane bond was determined by the presence of vibration peaks at from 1000 to 1100 $cm^{-1}$.

The results are shown in Table 1 and Table 2. A sample after heating under a nitrogen atmosphere at 250° C. for 1 hour was used in FT-IR measurement.

(Confirmation of Surface Smoothness)

—SPM Morphology Observation—

The surface smoothness of the adhesion layer was evaluated by morphology observation with SPM. Measurement was carried out in an area of 3 microns×3 microns square in a dynamic force microscope mode by use of SPA 400 (manufactured by Hitachi High-Technologies Corporation) as a scanning probe microscope (SPM). In a case in which the root mean square surface roughness (RMS) measured with SPM was 0.5 nm or less, the surface was determined to be "smooth".

The results are shown in Table 1 and Table 2. Any film after heating at 400° C. for 10 minutes was an objective of SPM morphology observation.

(Thickness Uniformity in Wafer)

The surface of each of the adhesion layers was visually observed, and any adhesion layer in which any of unevenness such as an interference pattern, a particle (an aggregate of any component in the adhesion layer), or cissing (a portion where the adhesion layer was not partially formed) was observed was rated as "C" with no uniformity in wafer. Each adhesion layer other than those rated as "C" was subjected to thickness distribution measurement with an ellipsometer (optical porosimeter (PS-1100) manufactured by manufactured by SEMILAB JAPAN K.K.). Specifically, a silicon wafer having a diameter of 4 inches (before bonding) on which the composition was formed into a film was cut to a size of 1 cm×1 cm square, and the film thickness in the wafer was measured with respect to 1 cm. Any sample where the difference in film thickness between the maximum film thickness and the minimum film thickness was 10% or less of average film thickness was determined to be excellent in thickness uniformity in wafer and was rated as "A".

The results are shown in Table 1 and Table 2.

<Formation of Stacked Substrates Body>

Example 1 to Example 3 and Comparative Example 1 to Comparative Example 4

A silicon bare wafer having a diameter of 4 inches (second substrate), treated with UV ozone for 5 minutes, was attached onto a silicon wafer (first substrate), on which the adhesion layer was formed. Such an operation corresponded to the sixth step. Next, the resultant was subjected to thermal compression bonding in a pressing apparatus at 250° C. and at 1 MPa for 1 hour (60 minutes), thereby providing a stacked substrates body. Such an operation corresponded to the heating step.

<Formation of Stacked Substrates Body>

Example 4

A silicon wafer (first substrate) on which the adhesion layer was formed was heated under a nitrogen atmosphere at 400° C. for 10 minutes. Next, a silicon bare wafer having a diameter of 4 inches (second substrate), treated with UV ozone for 5 minutes, was attached onto the silicon wafer (first substrate) on which the adhesion layer was formed. The resultant was subjected to thermal compression bonding in a pressing apparatus at 250° C. and at 1 MPa for 1 hour (60 minutes), thereby providing a stacked substrates body.

<Formation of Stacked Substrates Body>

Example 5 and Example 7 to Example 11

A silicon wafer (first substrate) on which the adhesion layer was formed was heated under a nitrogen atmosphere at 400° C. for 10 minutes. Next, a silicon bare wafer having a diameter of 4 inches (second substrate), treated with UV ozone for 5 minutes, was attached onto the silicon wafer (first substrate) on which the adhesion layer was formed. The resultant was subjected to compression bonding in a pressing apparatus at 23° C. and at 1 MPa for 1 minute, thereby providing a stacked substrates body. Such an operation corresponded to the pressurizing step.

<Formation of Stacked Substrates Body>

Example 6 and Comparative Example 5

A silicon wafer (first substrate) on which the adhesion layer was formed was heated under a nitrogen atmosphere at 400° C. for 10 minutes. Next, a silicon bare wafer having a diameter of 4 inches (second substrate), treated with UV ozone for 5 minutes, was attached onto the silicon wafer (first substrate) on which the adhesion layer was formed. The resultant was subjected to compression bonding in a pressing apparatus at 23° C. and at 1 MPa for 1 minute. Next, the resultant was heated under a nitrogen atmosphere at 400° C. for 30 minutes, thereby providing a stacked substrates body.

Each of the resulting substrate laminated bodies of Examples and Comparative Examples was evaluated with respect to the tensile bonding strength, the outgas, and the void.

(Tensile Bonding Strength)

Each of the substrate laminated bodies was cut to a size of 1 cm×1 cm square by use of a dicer (DAD 3240 manufactured by DISCO).

Subsequently, a metal pin having a diameter of 7 mm, with an epoxy resin, was allowed to adhere to both the upper and lower surfaces of each of the stacked substrates body cut (cured by epoxy at room temperature), thereby forming a sample for tensile bonding strength measurement.

The sample for tensile bonding strength measurement was used to perform measurement of a yield point with a tensile tester. Each of the tensile bonding strengths determined from such a yield point is shown in Table 1 and Table 2.

(Measurement of Outgas)

Each of the substrate laminated bodies was cut to a size of 7 mm×7 mm square by use of a dicer (DAD 3240 manufactured by DISCO), thereby producing a sample for outgas measurement. The sample for outgas measurement was used for measurement of the amount of outgas due to heating, with EMD-WA 1000S manufactured by ESCO Co., Ltd. The atmosphere pressure (base pressure) was $10^{-7}$ Pa and the rate of temperature rise was 30° C./min. The surface temperature of the silicon substrate was determined as the temperature of a thermocouple under a stage, calibrated by use of a peak derived from the outgas from a standard specimen ($H^+$-injected silicon, $CaC_2O_4$-dropped and $Ar^+$-injected silicon wafer).

The temperature at which the pressure of outgas reached $2\times10^{-6}$ Pa was determined with temperature rise. The results are shown in Table 1 and Table 2. A higher temperature means less occurrence of outgas.

(Void Measurement)

Each of the substrate laminated bodies was disposed on a stage on an IR lamp of IR 200 manufactured by SUESS MICROTEC SE. Next, void observation was performed by an IR camera disposed on the stage, with the second substrate being interposed. The total void area was divided by the total area where transmitted light could be observed, and thus the void area ratio was calculated. A void area ratio of 30% or less was rated as "favorable", and a void area ratio of more than 30% was rated as "poor".

The results are shown in Table 1 and Table 2.

TABLE 1

| | | Manufacturing conditions | | | | | | | | | | | | Evaluation results | | | | | | |
|---|---|---|---|---|---|---|---|---|---|---|---|---|---|---|---|---|---|---|---|---|---|
| | | Heating step | | | | | | | | Pressurizing step | | | Post-heating step | | Thickness of adhesion layer | | | | | | Temp. at outgas pressure of 2×10⁻⁶ Pa |
| | | Low-temp. heating step | | High-temp. heating step | | High-temp. heating step (pressing) | | | | | | | | | | Smoothness | Thickness uniformity in wafer | Cross-linked structure | Tensile bonding strength | Void | |
| | Sample | Te* | Ti* | Te* | Ti* | Te* | Pr* | Ti* | | Te* | Pr* | Ti* | Te* | Ti* | (nm) | | | | (mPa) | | (°C.) |
| Ex. 1 | Solution 1:3APDES (2% by mass) + 1prheTMA [1.03] + FA{1.83} + 1PrOH (86.6% by mass) | 125 | 1 | — | — | 250 | 1 | 60 | | — | — | — | — | — | 85.4 | Smooth | A | Amide-imide + siloxane | >25.8 | — | 450 |
| Ex. 2 | Solution 2:3APDES (0.2% by mass) + 1prheTMA [1.03] + FA{1.83} + 1PrOH (68.6% by mass) | 125 | 1 | — | — | 250 | 1 | 60 | | — | — | — | — | — | 8.5 | Smooth | A | Amide-imide + siloxane | >5 | — | — |
| Ex. 3 | Solution 3:BPEI (0.15% by mass) + TMA [1.5] + NH₃ <1.5> | 125 | 1 | — | — | 250 | 1 | 60 | | — | — | — | — | — | 6.9 | Smooth | A | Amide-imide | >5 | — | — |
| Ex. 4 | Solution 4:3APDES (2% by mass) + ehePMA[1] + 1PrOH (33.3% by mass) + EtOH (31.7% by mass) | 125 | 1 | 400 | 10 | — | — | — | | — | — | — | — | — | 104 | Smooth | A | Imide + siloxane | >10.7 | Favorable | — |
| Ex. 5 | Solution 4:3APDES (2% by mass) + ehePMA[1] + 1PrOH (33.3% by mass) + EtOH (31.7% by mass) | 125 | 1 | 400 | 10 | — | — | — | | 23 | 1 | 1 | — | — | 104 | Smooth | A | Imide + siloxane | >18.5 | Favorable | 515 |
| Ex. 6 | Solution 4:3APDES (2% by mass) + ehePMA[1] + 1PrOH (33.3% by mass) + EtOH (31.7% by mass) | 125 | 1 | 400 | 10 | — | — | — | | 23 | 1 | 1 | 400 | 30 | 104 | Smooth | A | Imide + siloxane | >30.9 | Favorable | 531 |

TABLE 1-continued

| | | Manufacturing conditions | | | | | | | | | | | | | Evaluation results | | | | | |
|---|---|---|---|---|---|---|---|---|---|---|---|---|---|---|---|---|---|---|---|---|---|
| | | Heating step | | | | | | | | | | | | | | | | | | | |
| | | Low-temp. heating step | | High-temp. heating step | | High-temp. heating step (pressing) | | | Pressurizing step | | | Post-heating step | | Thickness of adhesion layer | | | Cross-linked | Tensile bonding strength | | Temp. at outgas pressure of 2 × 10⁻⁶ Pa |
| | Sample | Te* | Ti* | Te* | Ti* | Te* | Pr* | Ti* | Te* | Pr* | Ti* | Te* | Ti* | (nm) | Smoothness | Thickness uniformity in wafer | structure | (mPa) | Void | (°C.) |
| Ex. 7 | Solution 1:3APDES (2% by mass) + 1prheTMA[1.03] + FA{1.83} + 1PrOH (86.6% by mass) | 125 | 1 | 400 | 10 | — | — | — | 23 | 1 | 1 | — | — | 85.9 | Smooth | A | Amide-imide + siloxane | >17.1 | Favorable | 487 |
| Ex. 8 | Solution 5:3APTES(2% by mass) + PMA[1] + NH₃<1> | 125 | 1 | 400 | 10 | — | — | — | 23 | 1 | 1 | — | — | 32 | Smooth | A | Amide-imide + siloxane | >16.0 | Favorable | 488 |
| Ex. 9 | Solution 6:3APTES(2% by mass) + TMSA[0.5] + NH₃<1.5> | 125 | 1 | 400 | 10 | — | — | — | 23 | 1 | 1 | — | — | 28.7 | Smooth | A | Amide + siloxane | >13.7 | Favorable | 490 |
| Ex. 10 | Solution 7:3APDES (10% by mass) + ehePMA[1] + 1PrOH (33.3% by mass) + EtOH (25.2% by mass) | 125 | 1 | 400 | 10 | — | — | — | 23 | 1 | 1 | — | — | 720 | Smooth | A | Imide + siloxane | >14.5 | Favorable | 444 |
| Ex. 11 | Solution 8:3APDES (20% by mass) + ehePMA[1] + 1PrOH (2.5% by mass) + EtOH (41.3% by mass) | 125 | 1 | 400 | 10 | — | — | — | 23 | 1 | 1 | — | — | 2536 | Smooth | A | Imide + siloxane | >16.8 | Favorable | 428 |

"Ex." represents "Example",
"Temp." represents "Temperature",
"Te*" represents "Temperature (° C.)",
"Ti*" represents "Time (min)", and
"Pr*" represents "Pressure (MPa)".

TABLE 2

| | | Manufacturing conditions | | | | | | | | | | | |
|---|---|---|---|---|---|---|---|---|---|---|---|---|---|
| | | Heating step | | | | | | | | | | | |
| | | Low-temp. heating step | | High-temperature heating step | | High-temperature heating step (pressing) | | | Pressurizing step | | | Post-heating step | |
| | Sample | Te* | Ti* | Te* | Ti* | Te* | Pr* | Ti* | Te* | Pr* | Ti* | Te* | Ti* |
| Comp. Ex. 1 | Solution 9:BPDA-pDA polyamic acid(2.5% by mass) + NMP(97.5% by mass) | 125 | 1 | — | — | 250 | 1 | 60 | — | — | — | — | — |
| Comp. Ex. 2 | Solution 10:pxDA(3% by mass) + TMSA[1] + NH$_3$<1.5> + 1PrOH (12% by mass) | 125 | 1 | — | — | 250 | 1 | 60 | — | — | — | — | — |
| Comp. Ex. 3 | Solution 11:BPEI (0.15% by mass) + MA[1.0] | 125 | 1 | — | — | 250 | 1 | 60 | — | — | — | — | — |
| Comp. Ex. 4 | Solution 12:3APDES (2% by mass) + MA[1.0] | 125 | 1 | — | — | 250 | 1 | 60 | — | — | — | — | — |
| Comp. Ex. 5 | Solution 13:TEOS(8.4% by mass) + EtOH (12.9% by mass) + 1PrOH (75% by mass) + HNO$_3$(0.075% by mass) | 125 | 1 | 400 | 10 | — | — | — | 23 | 1 | 1 | 400 | 30 |

| | | Evaluation results | | | | | | |
|---|---|---|---|---|---|---|---|---|
| | Sample | Thickness of adhesion layer (nm) | Smoothness | Thickness uniformity in wafer | Cross-linked structure | Tensile bonding strength (mpa) | Void | Temp. at outgas pressure of $2 \times 10^{-6}$ Pa (° C.) |
| Comp. Ex. 1 | Solution 9:BPDA-pDA polyamic acid(2.5% by mass) + NMP(97.5% by mass) | 2000 | — | C (unevenness) | Imide | NG (released in dicing) | — | — |
| Comp. Ex. 2 | Solution 10:pxDA (3% by mass) + TMSA[1] + NH$_3$<1.5> + 1PrOH (12% by mass) | 236 | — | C (particle) | — | NG (released in dicing) | Poor | 370 |
| Comp. Ex. 3 | Solution 11: BPEI (0.15% by mass) + MA[1.0] | 1.2 | — | — | — | 0 | — | — |
| Comp. Ex. 4 | Solution 12:3APDES (2% by mass) + MA[1.0] | — | — | C (partial cissing) | — | — | Poor | — |

TABLE 2-continued

| | | | | | | | | | |
|---|---|---|---|---|---|---|---|---|---|
| Comp. Ex. 5 | Solution 13:TEOS (8.4% by mass) + EtOH (12.9% by mass) + 1PrOH (75% by mass) + HNO₃ (0.075% by mass) | 73.5 | Smooth | A | | Siloxane | NG (released in dicing) | Poor | 354 |

"Comp. Ex." represents "Comparative Example",
"Temp." represents "Temperature",
"Te*" represents "Temperature(° C.)",
"Ti*" represents "Time (min)", and
"Pr*" represents "Pressure (MPa)".

It was found that each of the substrate laminated bodies of Examples had a bonding strength of 5 MPa or more and a high bonding strength was obtained by forming the reaction product of the compound (A) and the crosslinking agent (B) into the adhesion layer. It was also found that a thin film of from 6.9 nm to 2536 nm was formed on each of the adhesion layers used in Examples 1 to 11. The stacked substrates body of Comparative Example 4 was not suitable as a stacked substrates body because a plurality of portions having a size of several mm, with cissing of the adhesion layer, was caused on the silicon wafer.

The substrate laminated bodies of Examples 4 to 11 where void evaluation was performed were suppressed in the occurrence of void as compared with those of Comparative Example 2, Comparative Example 4 and Comparative Example 5 where void evaluation was performed.

The substrate laminated bodies of Example 1 and Examples 5 to 11 where outgas evaluation was performed exhibited a high temperature at which the pressure of outgas reached $2\times10^{-6}$ Pa and were suppressed in the occurrence of outgas as compared with those of Comparative Example 2 and Comparative Example 5 where outgas evaluation was performed.

The stacked substrates body of each of Examples is presumed based on the above to hardly cause unintended releasing to occur as compared with the stacked substrates body of each of Comparative Examples.

The disclosure of Japanese Patent Application No. 2017-090591 filed on Apr. 28, 2017 is incorporated herein by reference in its entirety.

All documents, patent applications, and technical standards described in this specification are incorporated herein by reference to the same extent as if each individual document, patent application, and technical specification were specifically and individually indicated to be incorporated by reference.

The invention claimed is:

1. A body, comprising stacked substrates, wherein:
a first substrate,
an adhesion layer comprising a reaction product of a compound (A), which has a cationic functional group containing at least one of a primary nitrogen atom or a secondary nitrogen atom, and a cross-linking agent (B), which has three or more —C(=O)OX groups in a molecule, in which from one to six of the three or more —C(=O)OX groups are —C(=O)OH groups, which has a weight average molecular weight of from 200 to 600, X being a hydrogen atom or an alkyl group having from 1 to 6 carbon atoms, and in which at least one X in the three or more —C(=O)OX groups is an alkyl group having from 1 to 6 carbon atoms, and
a second substrate,
are layered in this order, and
the compound (A) comprises a siloxane polymer having a siloxane bond (Si—O bond) and an amino group and having a weight average molecular weight of from 130 to 10,000.

2. The body, comprising stacked substrates, according to claim 1, wherein the adhesion layer has a thickness of from 0.1 nm to 5,000 nm.

3. The body, comprising stacked substrates, according to claim 1, having a tensile bonding strength of 5 MPa or more.

4. The body, comprising stacked substrates, according to claim 1, wherein the cross-linking agent (B) has a ring structure in the molecule.

5. The body, comprising stacked substrates, according to claim 4, wherein the ring structure in the cross-linking agent (B) is a ring structure having two or more —C(=O)OX groups.

6. The body, comprising stacked substrates, according to claim 4, wherein the ring structure is at least one of a benzene ring or a naphthalene ring.

7. The body, comprising stacked substrates, according to claim 1 wherein the siloxane polymer having a siloxane bond (Si—O bond) and an amino group and having a weight average molecular weight of from 130 to 10,000 satisfies a relationship of (non-cross-linkable group)/Si<2 as a molar ratio of a non-cross-linkable group bound to an Si element, to the Si element.

8. The body, comprising stacked substrates, according to claim 1, wherein the reaction product has at least one of an amide bond or an imide bond.

9. The body, comprising stacked substrates, according to claim 1, wherein a temperature at which a pressure of outgas under a reduced pressure reaches $2\times10^{-6}$ Pa is 400° C. or more.

10. The body, comprising stacked substrates, according to claim 1, wherein at least one of the first substrate or the second substrate is provided with an electrode at a surface thereof, the surface being closer to the adhesion layer.

11. The body, comprising stacked substrates, according to claim 1, wherein at least one of the first substrate or the second substrate comprises at least one element selected from the group consisting of Si, Al, Ti, Zr, Hf, Fe, Ni, Cu, Ag, Au, Ga, Ge, Sn, Pd, As, Pt, Mg, In, Ta and Nb.

12. The body, comprising stacked substrates, according to claim 11, wherein at least one of the first substrate or the second substrate is a semiconductor substrate comprising at least one element selected from the group consisting of Si, Ga, Ge and As.

13. A method of manufacturing a body comprising stacked substrates, the method comprising:
a first step of forming, on a first substrate, a film comprising a compound (A), which has a cationic functional group containing at least one of a primary nitrogen atom or a secondary nitrogen atom;
a second step of providing, on the film, a cross-linking agent (B), which has three or more —C(=O)OX groups in a molecule, in which from one to six of the three or more —C(=O)OX groups are —C(=O)OH groups and which has a weight average molecular weight of from 200 to 600, X being a hydrogen atom or an alkyl group having from 1 to 6 carbon atoms;
a third step of layering a second substrate on a surface on which a film comprising the compound (A) and the cross-linking agent (B) is formed; and
a heating step of heating the film comprising the compound (A) and the cross-linking agent (B) to a temperature of from 70° C. to 450° C., thereby forming an adhesion layer comprising a reaction product of the compound (A) and the cross-linking agent (B),
wherein the compound (A) comprises a compound having a siloxane bond (Si—O bond) and an amino group and having a weight average molecular weight of from 130 to 10,000.

14. A method of manufacturing a body comprising stacked substrates, the method comprising:
a fifth step of forming, on a first substrate, a film comprising a compound (A), which has a cationic functional group containing at least one of a primary nitrogen atom or a secondary nitrogen atom, and a cross-linking agent (B), which has three or more —C(=O)OX groups in a molecule, in which from one to six of the three or more —C(=O)OX groups are —C(=O)OH groups and which has a weight average molecular weight of from 200 to 600, X being a hydrogen atom or an alkyl group having from 1 to 6 carbon atoms;
a sixth step of layering a second substrate on a surface at which the film including the compound (A) and the cross-linking agent (B) is formed; and
a heating step of heating the film comprising the compound (A) and the cross-linking agent (B) to a temperature of from 70° C. to 450° C., thereby forming an adhesion layer comprising a reaction product of the compound (A) and the cross-linking agent (B),
wherein the compound (A) comprises a compound having a siloxane bond (Si—O bond) and an amino group and having a weight average molecular weight of from 130 to 10,000.

15. The method of manufacturing a body comprising stacked substrates according to claim 13, wherein a surface of the first substrate or the second substrate, on which the film comprising the compound (A) and the cross-linking agent (B) is to be formed, has at least one selected from the group consisting of a hydroxyl group, an epoxy group, a carboxy group, an amino group and a mercapto group.

16. The method of manufacturing a body comprising stacked substrates according to claim 15, wherein:
at least one of the first substrate or the second substrate comprises at least one element selected from the group consisting of Si, Al, Ti, Zr, Hf, Fe, Ni, Cu, Ag, Au, Ga, Ge, Sn, Pd, As, Pt, Mg, In, Ta and Nb, and
the at least one selected from the group consisting of a hydroxyl group, an epoxy group, a carboxy group, an amino group and a mercapto group, is bound to the at least one element.

17. The method of manufacturing a body comprising stacked substrates according to claim 16, wherein the surface of the first substrate or the second substrate, on which the film including the compound (A) and the cross-linking agent (B) is to be formed, has a silanol group (Si—OH group).

\* \* \* \* \*